(12) United States Patent
Sugioka

(10) Patent No.: US 10,424,823 B2
(45) Date of Patent: Sep. 24, 2019

(54) TRANSMISSION LINE

(71) Applicant: Sony Corporation, Tokyo (JP)

(72) Inventor: Tatsuya Sugioka, Tokyo (JP)

(73) Assignee: Sony Corporation, Tokyo (JP)

( * ) Notice: Subject to any disclaimer, the term of this patent is extended or adjusted under 35 U.S.C. 154(b) by 66 days.

(21) Appl. No.: 15/561,719

(22) PCT Filed: Apr. 15, 2016

(86) PCT No.: PCT/JP2016/062088
§ 371 (c)(1),
(2) Date: Sep. 26, 2017

(87) PCT Pub. No.: WO2016/181758
PCT Pub. Date: Nov. 17, 2016

(65) Prior Publication Data
US 2018/0108967 A1 Apr. 19, 2018

(30) Foreign Application Priority Data

May 13, 2015 (JP) ................. 2015-097930

(51) Int. Cl.
| H01P 3/08 | (2006.01) |
|---|---|
| H04L 25/02 | (2006.01) |
| H04L 25/49 | (2006.01) |
| H05K 1/02 | (2006.01) |
| G08C 19/02 | (2006.01) |
| H05K 3/46 | (2006.01) |

(52) U.S. Cl.
CPC .............. *H01P 3/081* (2013.01); *G08C 19/02* (2013.01); *H01P 3/08* (2013.01); *H04L 25/02* (2013.01); *H04L 25/0272* (2013.01); *H04L 25/0278* (2013.01); *H04L 25/49* (2013.01); *H04L 25/4923* (2013.01); *H05K 1/02* (2013.01); *H05K 1/025* (2013.01); *H05K 3/46* (2013.01)

(58) Field of Classification Search
CPC .. H01P 3/08; H01P 3/081; H01P 3/082; H01P 3/088
USPC ...................... 333/238, 246, 1, 4, 5
See application file for complete search history.

(56) References Cited

U.S. PATENT DOCUMENTS

| 5,408,053 A * | 4/1995 | Young ..................... H01P 3/088 174/262 |
| 5,805,030 A | 9/1998 | Dhuey et al. |
| 8,064,535 B2 | 11/2011 | Wiley |
| 8,390,401 B2 * | 3/2013 | Pruvost ................... H01P 3/003 333/238 |
| 2001/0040490 A1* | 11/2001 | Tanaka .................... H01P 3/085 333/204 |

FOREIGN PATENT DOCUMENTS

| JP | 06-261092 A | 9/1994 |
| JP | 2006-128618 A | 5/2006 |
| JP | 2010-520715 A | 6/2010 |
| JP | 2015-023386 A | 2/2015 |

* cited by examiner

*Primary Examiner* — Stephen E. Jones
(74) *Attorney, Agent, or Firm* — Michael Best & Friedrich LLP

(57) ABSTRACT

A transmission line of the disclosure includes: a first line; a second line having characteristic impedance higher than characteristic impedance of the first line; and a third line. The transmission line transmits a symbol that corresponds to a combination of signals in the first line, the second line, and the third line.

13 Claims, 31 Drawing Sheets

[FIG. 1]
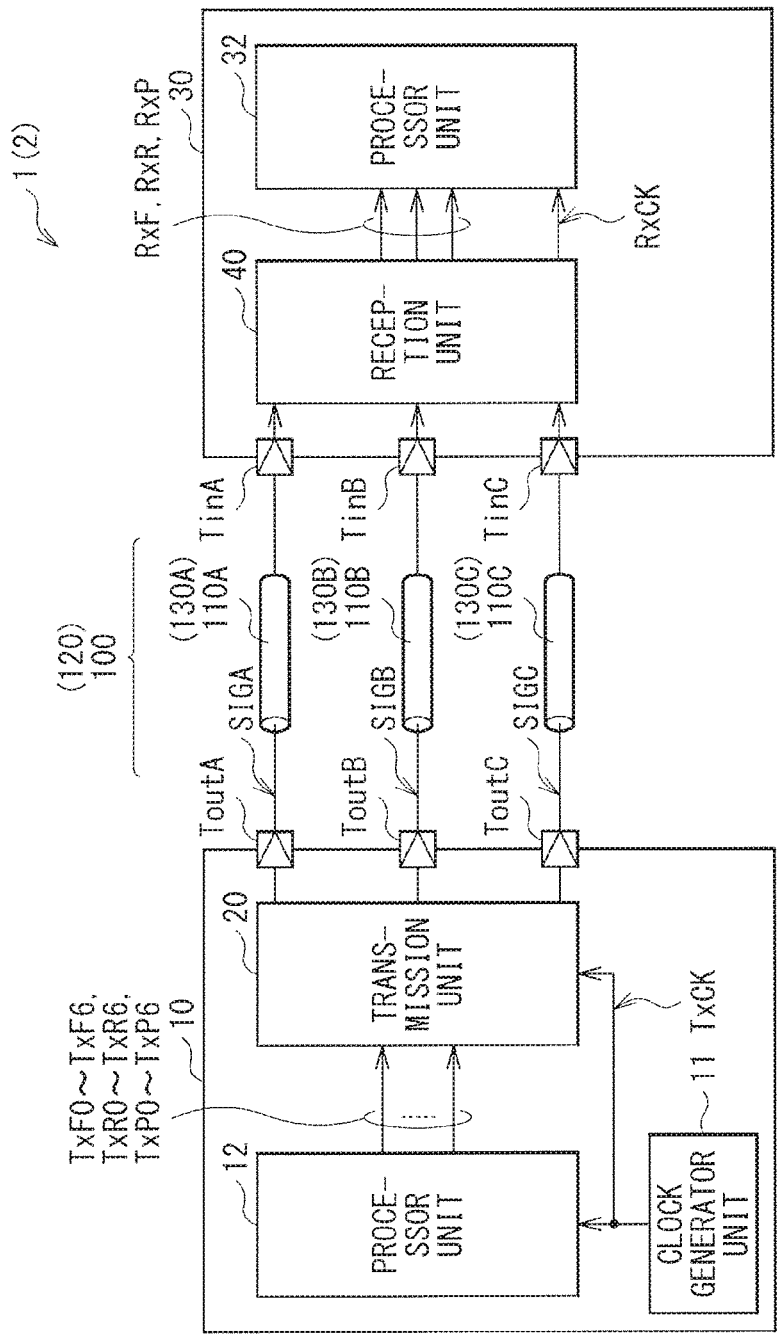

[ FIG. 2 ]
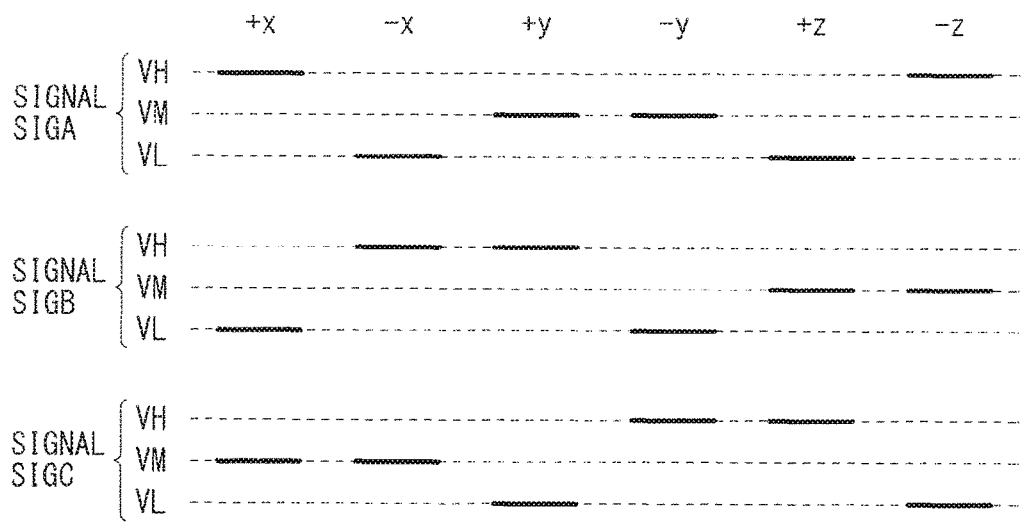
[ FIG. 3 ]
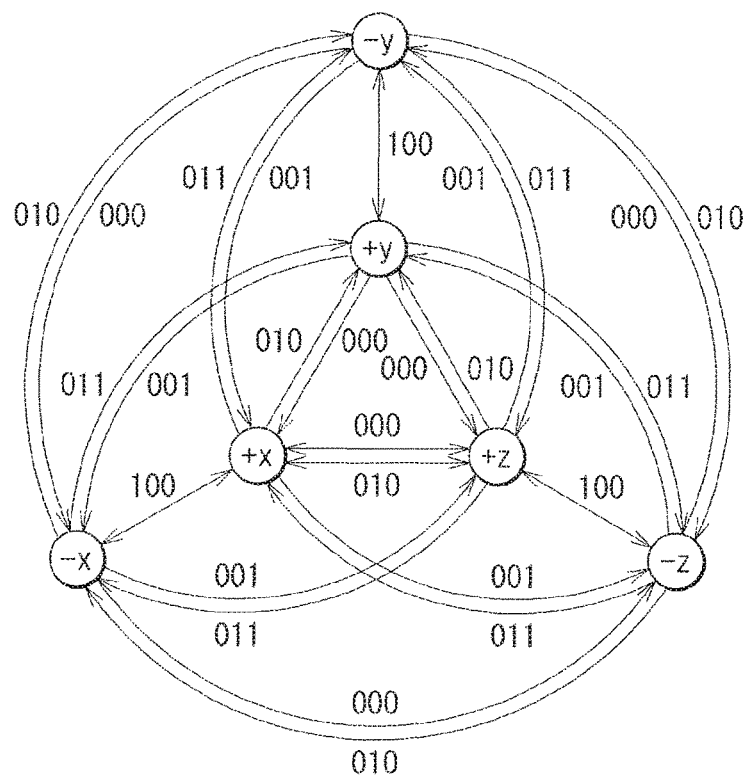

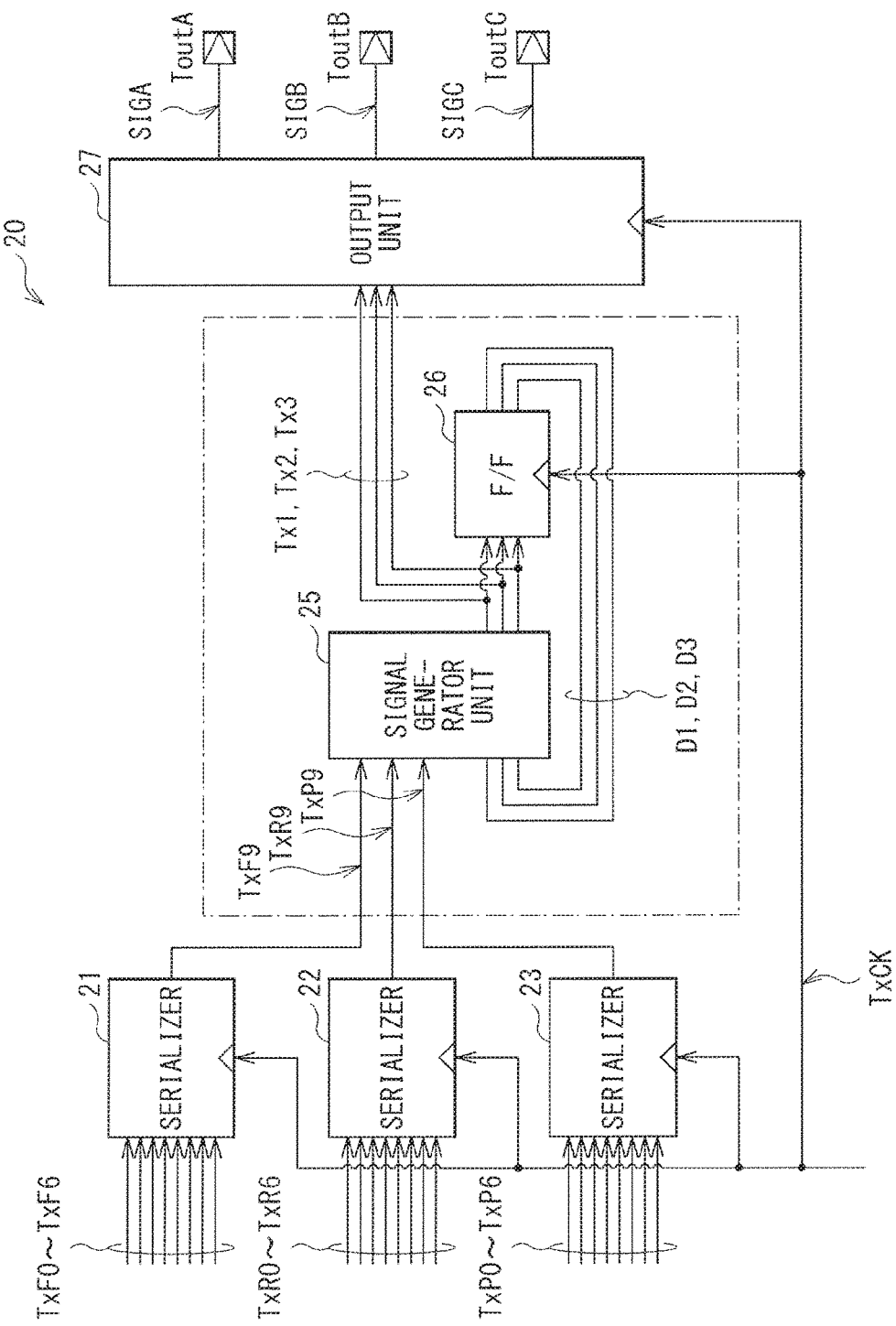
[FIG. 4]

[ FIG. 5 ]

| SYMBOL | SYMBOL SIGNAL Tx1 | SYMBOL SIGNAL Tx2 | SYMBOL SIGNAL Tx3 | SIGNAL SIGA | SIGNAL SIGB | SIGNAL SIGC |
|---|---|---|---|---|---|---|
| +x | 1 | 0 | 0 | VH | VL | VM |
| −x | 0 | 1 | 1 | VL | VH | VM |
| +y | 0 | 1 | 0 | VM | VH | VL |
| −y | 1 | 0 | 1 | VM | VL | VH |
| +z | 0 | 0 | 1 | VL | VM | VH |
| −z | 1 | 1 | 0 | VH | VM | VL |

[FIG.6]
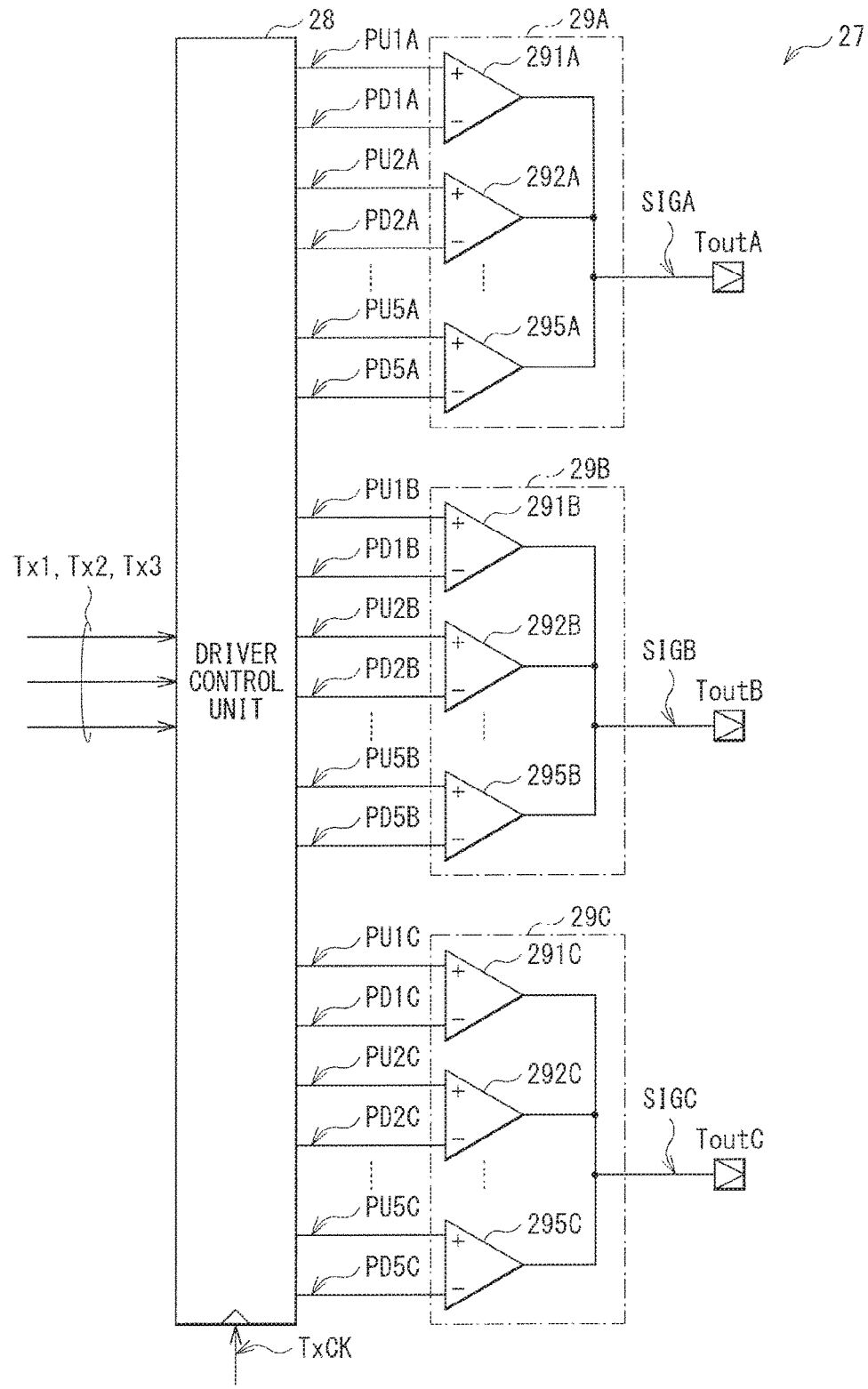

[ FIG. 7 ]
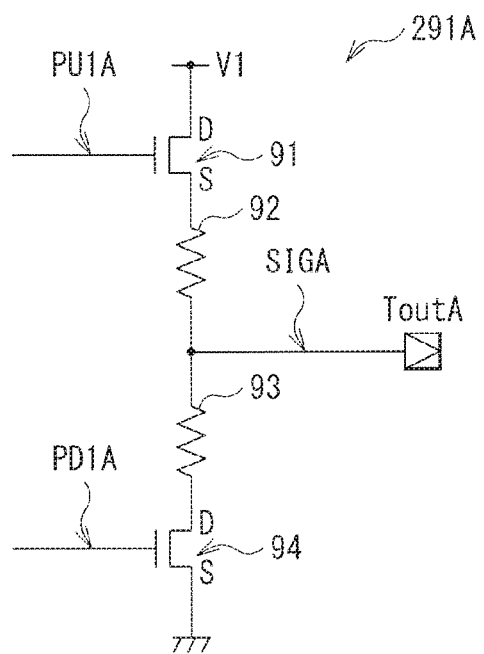

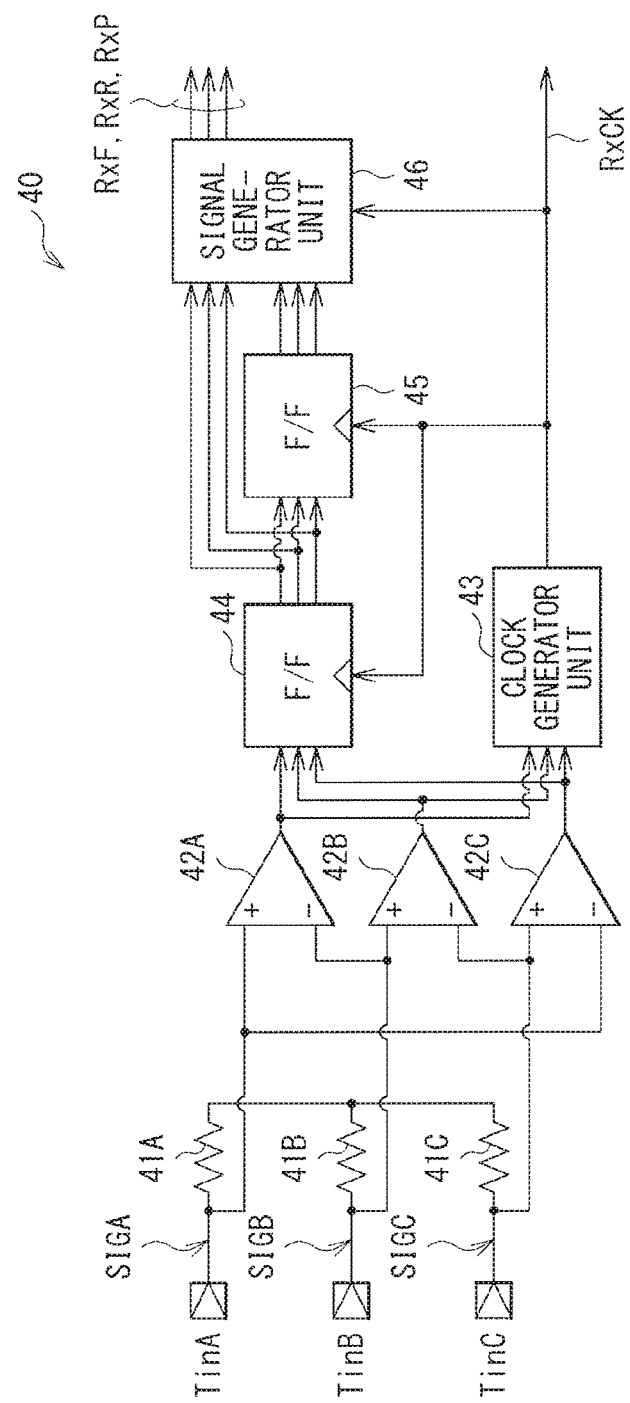
[FIG. 8]

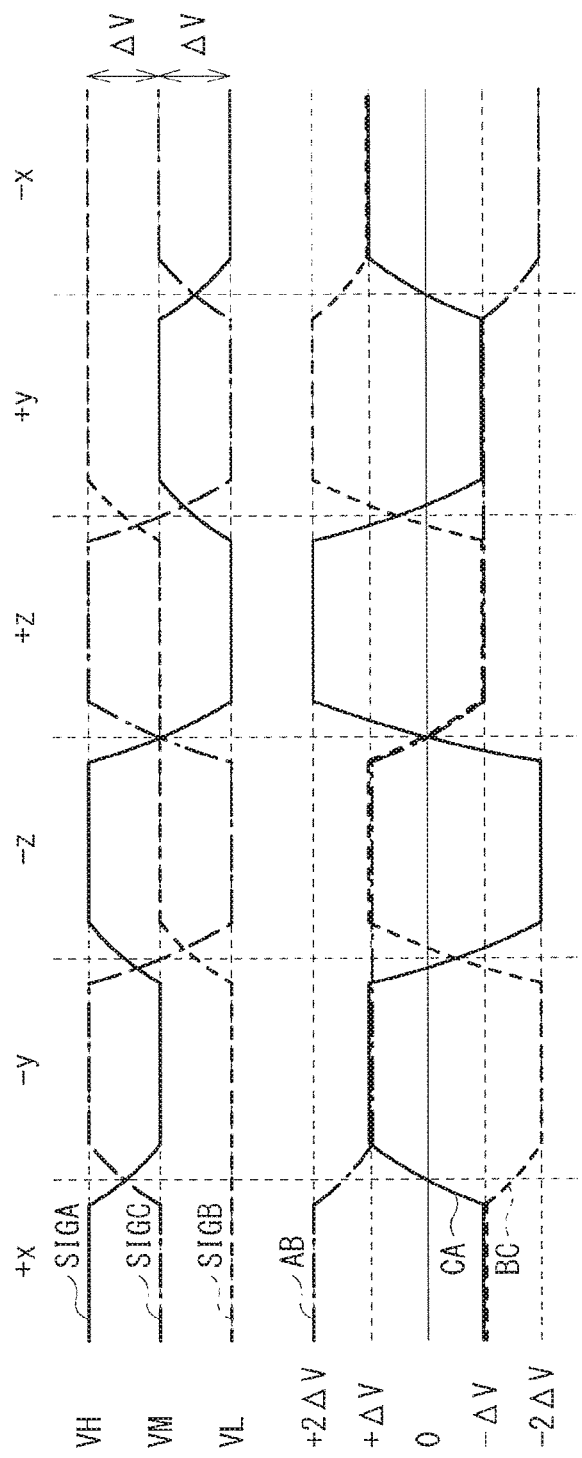
[FIG. 9]

[ FIG. 10 ]
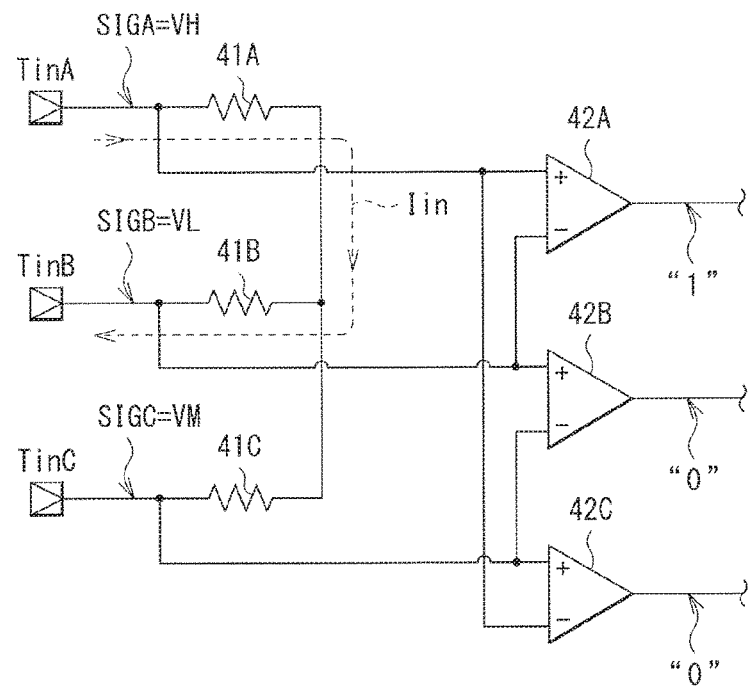
[ FIG. 11 ]
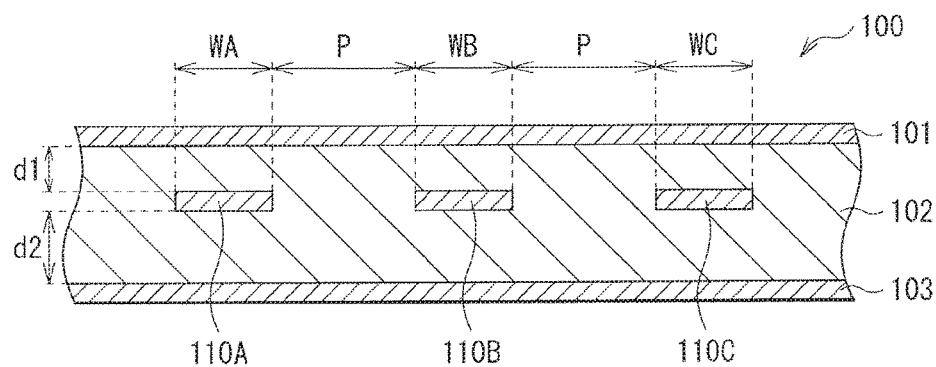

[ FIG. 12 ]
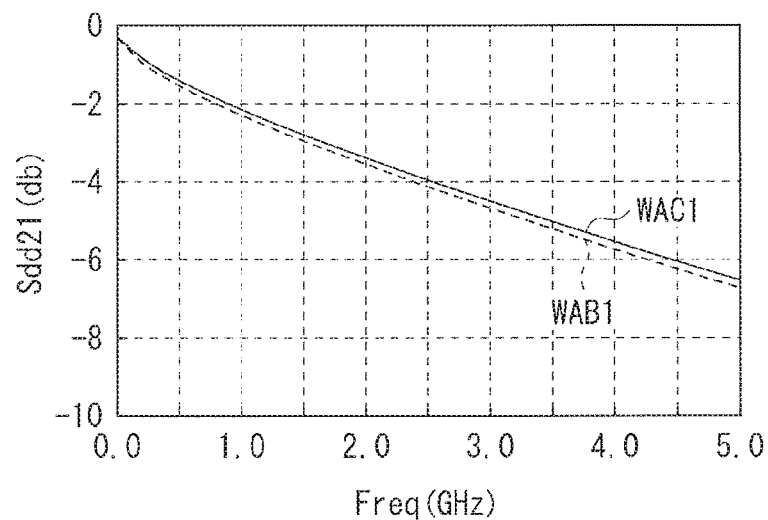
[ FIG. 13 ]
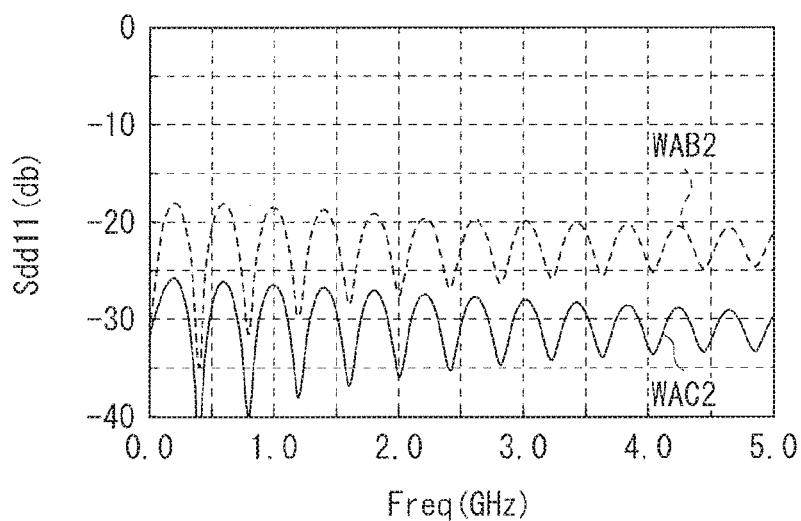

[ FIG. 14 ]
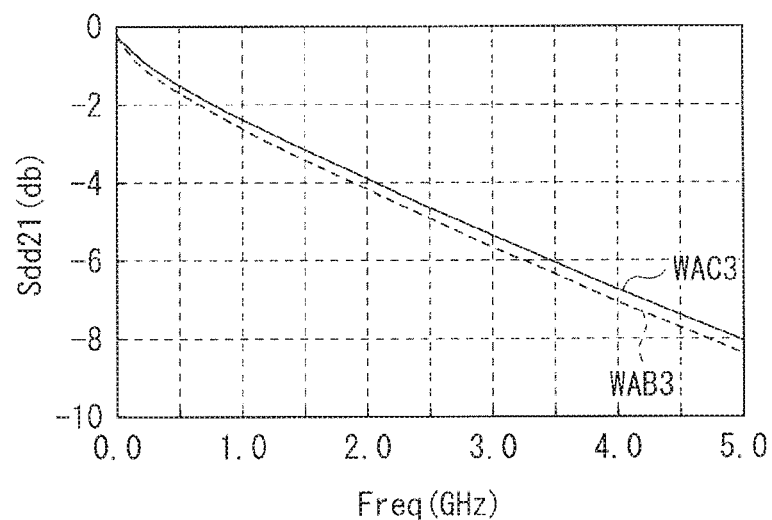
[ FIG. 15 ]
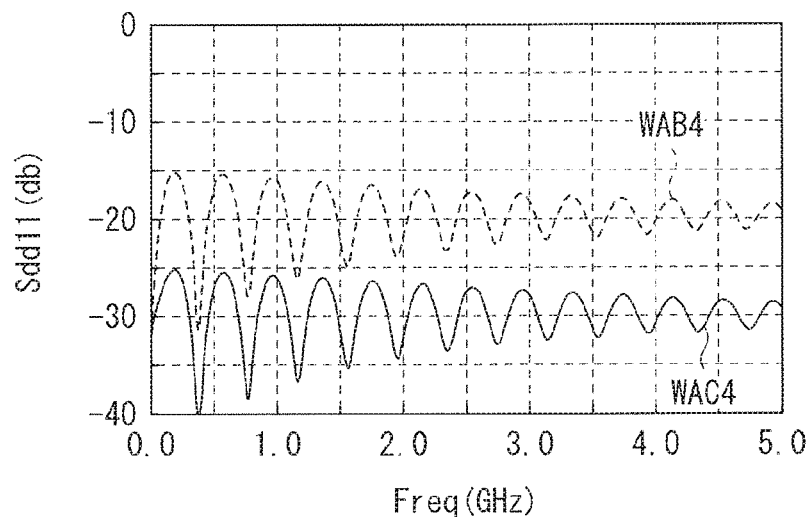

[ FIG. 16 ]
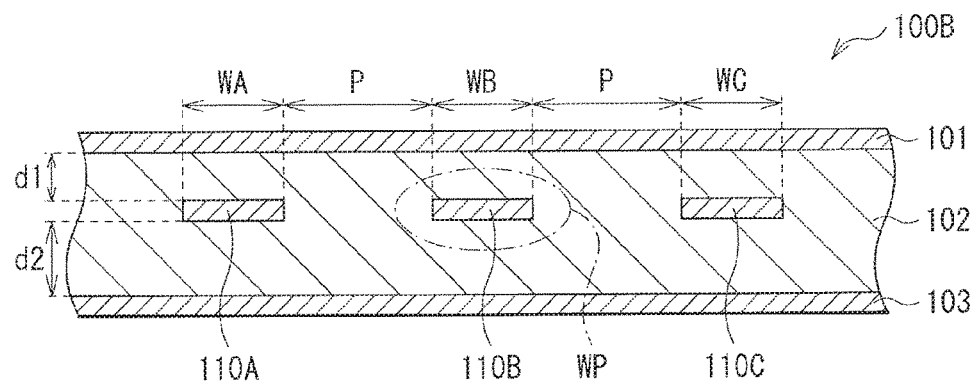
[ FIG. 17 ]
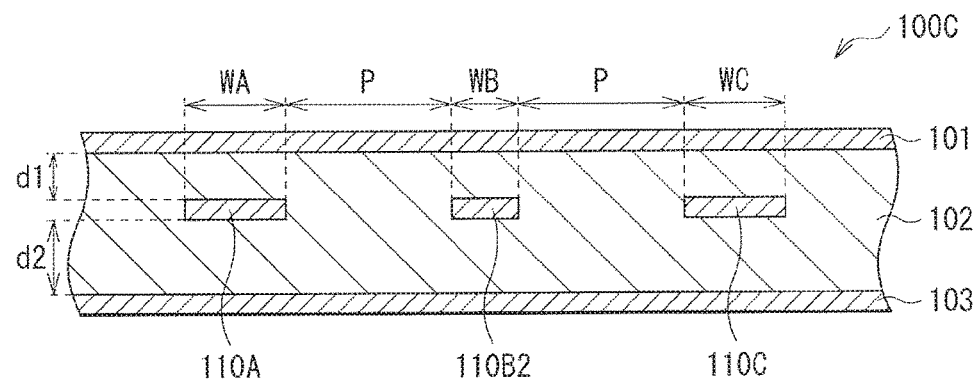
[ FIG. 18 ]
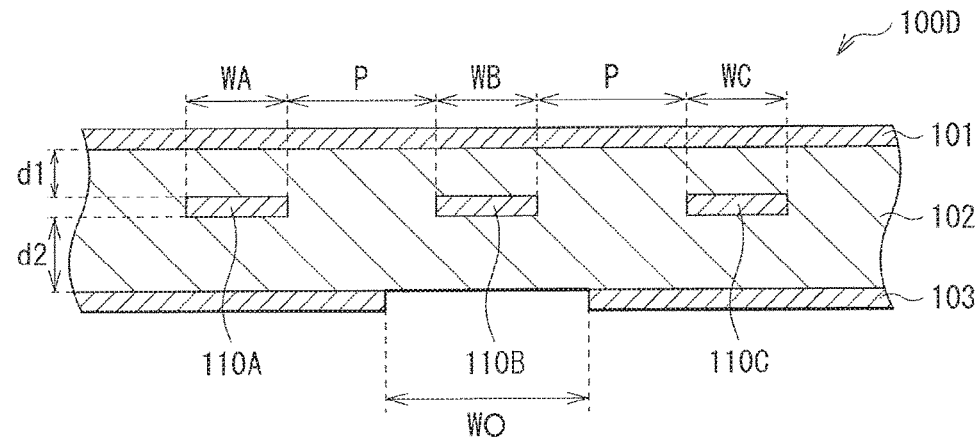

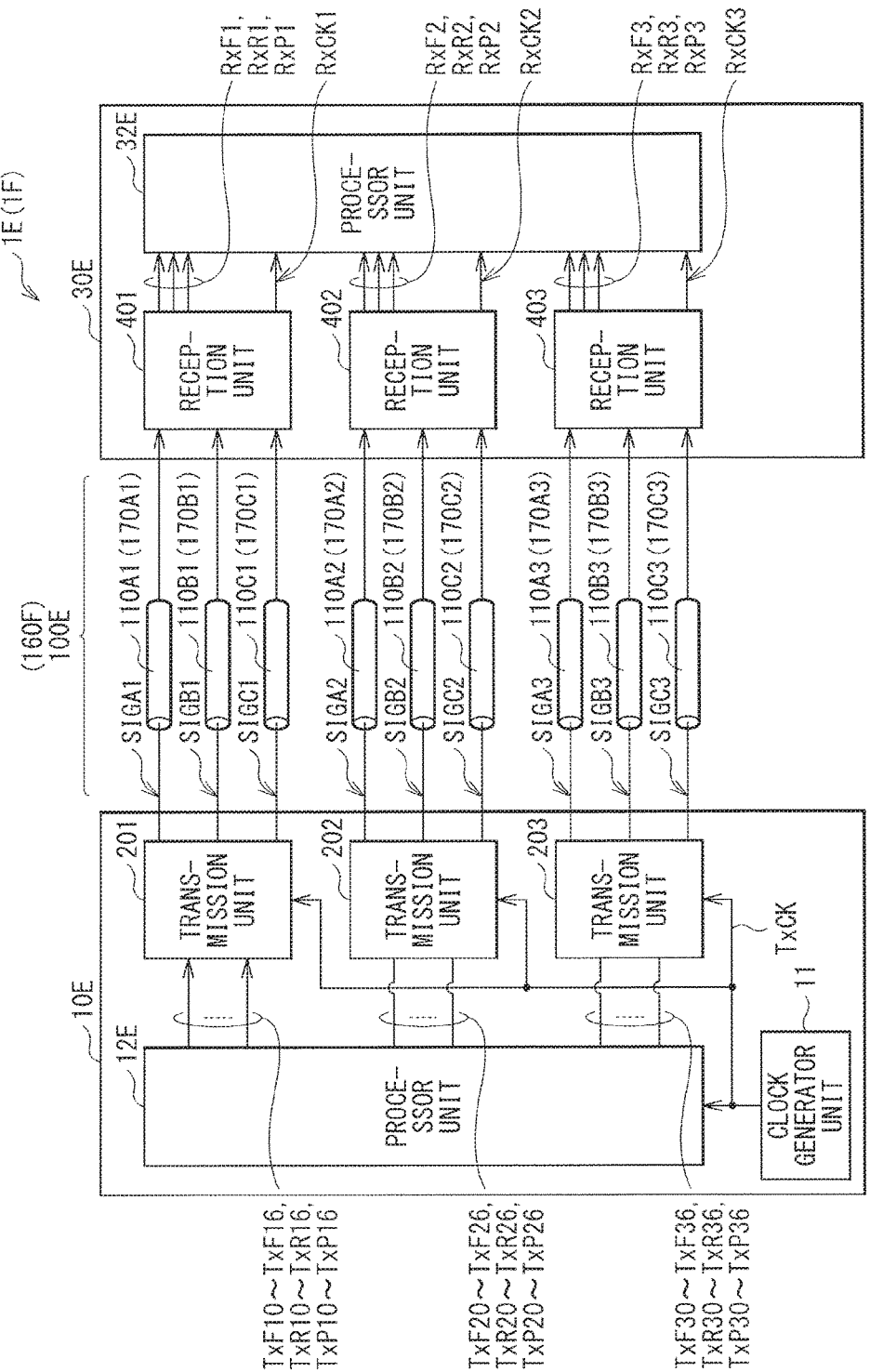
[FIG. 19]

[ FIG. 20 ]
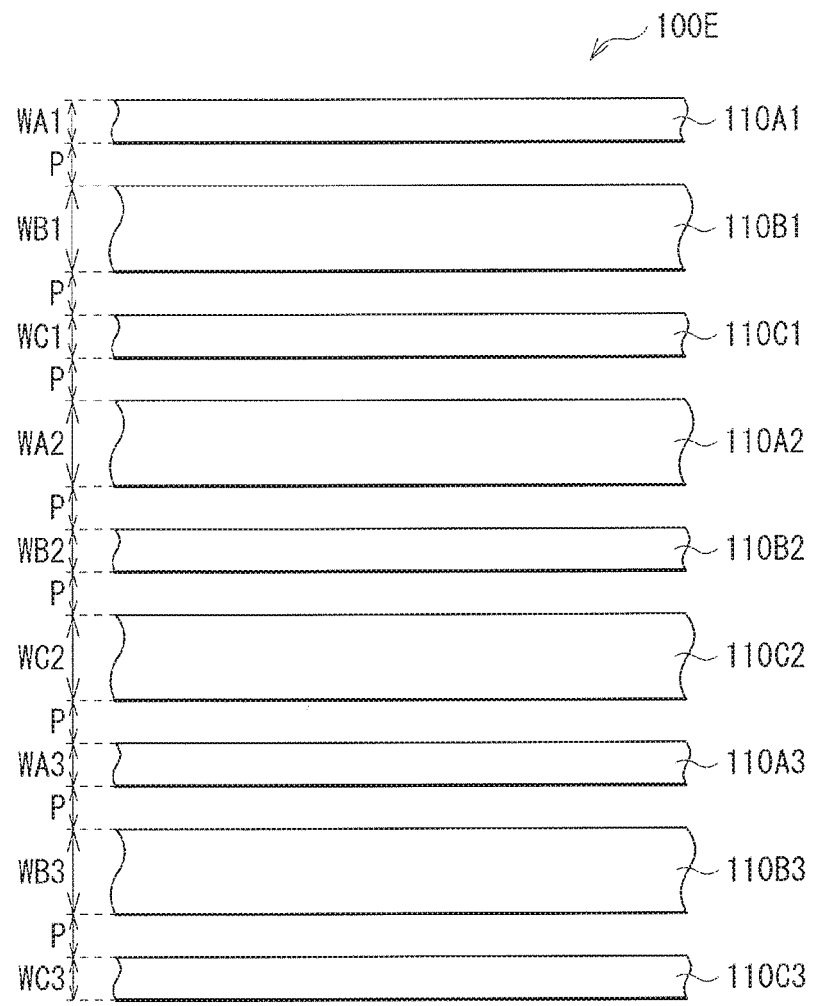

[ FIG. 21 ]

|  | 750MHz | 1.25GHz | 2.50GHz |
|---|---|---|---|
| LINE 110A1/LINE 110B1 | −1.999 (−2.088) | −2.767 (−2.981) | −4.385 (−4.922) |
| LINE 110B1/LINE 110C1 | −1.999 (−2.088) | −2.767 (−2.981) | −4.385 (−4.922) |
| LINE 110A1/LINE 110C1 | −1.966 (−1.948) | −2.732 (−2.768) | −4.327 (−4.626) |

[ FIG. 22 ]

|  | 750MHz | 1.25GHz | 2.50GHz |
|---|---|---|---|
| LINE 110A2/LINE 110B2 | −1.999 (−2.088) | −2.766 (−2.981) | −4.383 (−4.922) |
| LINE 110B2/LINE 110C2 | −1.999 (−2.088) | −2.766 (−2.981) | −4.383 (−4.922) |
| LINE 110A2/LINE 110C2 | −1.825 (−1.948) | −2.543 (−2.768) | −4.070 (−4.626) |

[ FIG. 23 ]
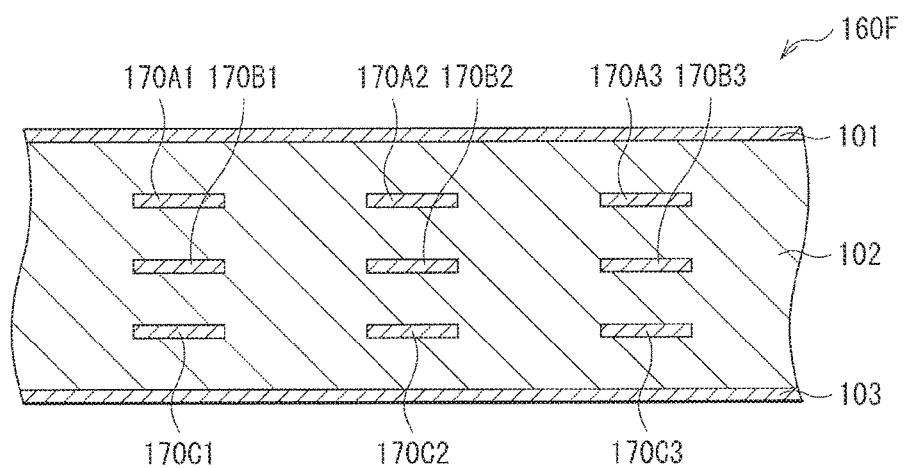
[ FIG. 24 ]
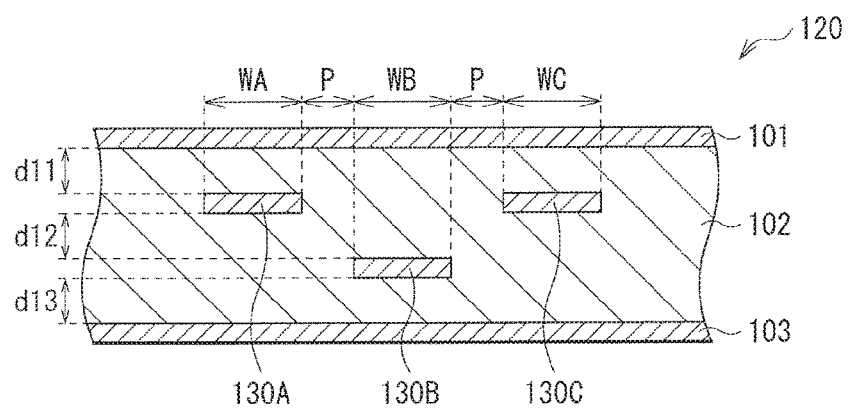

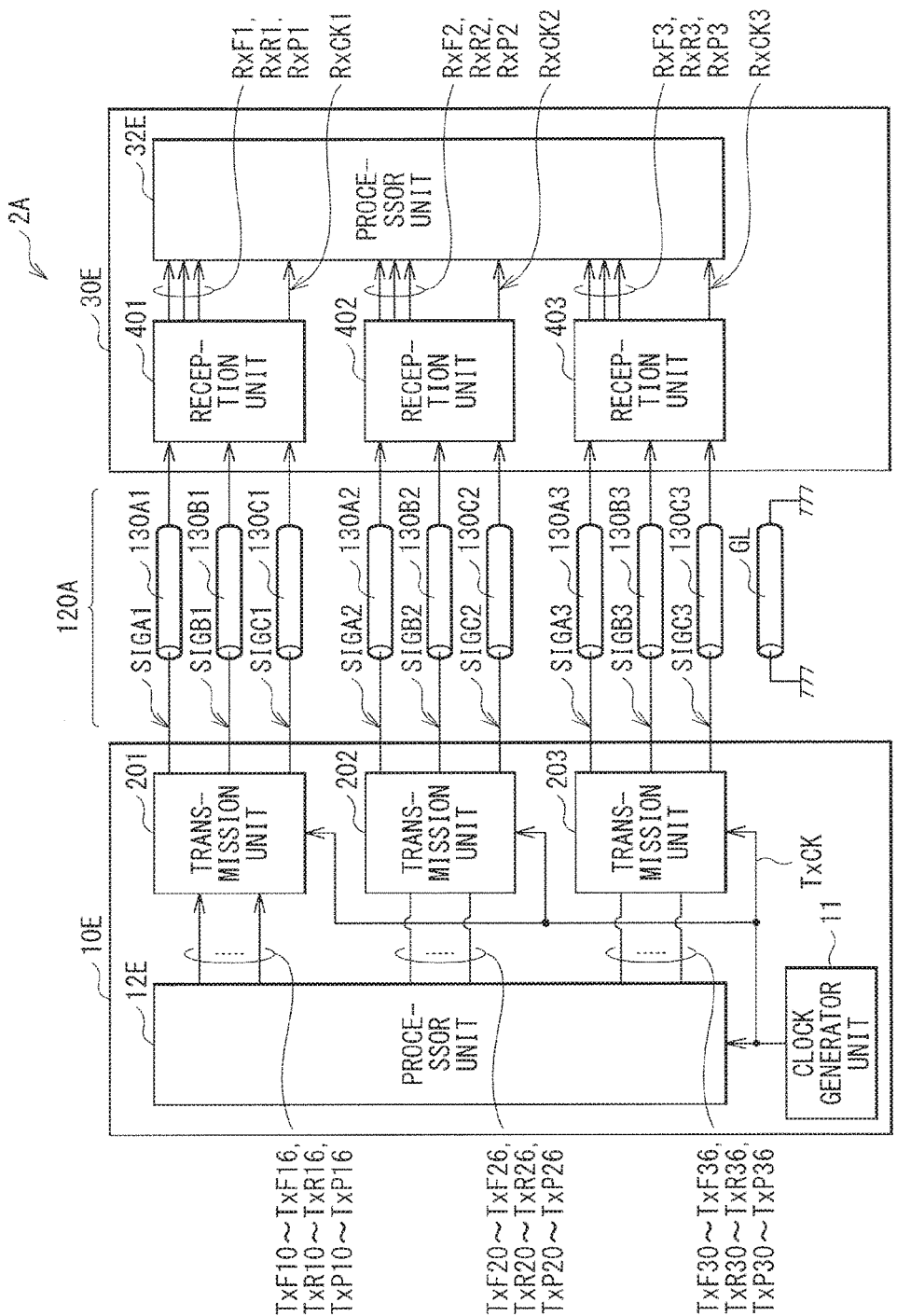
[ FIG. 25 ]

[ FIG. 26 ]
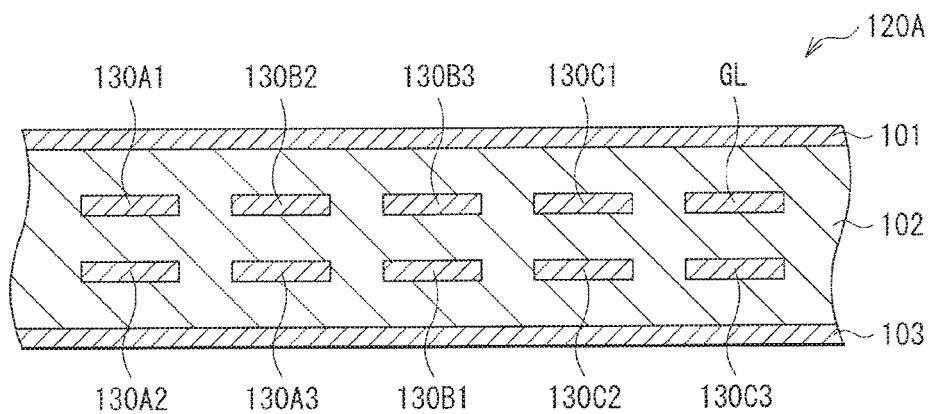
[ FIG. 27 ]
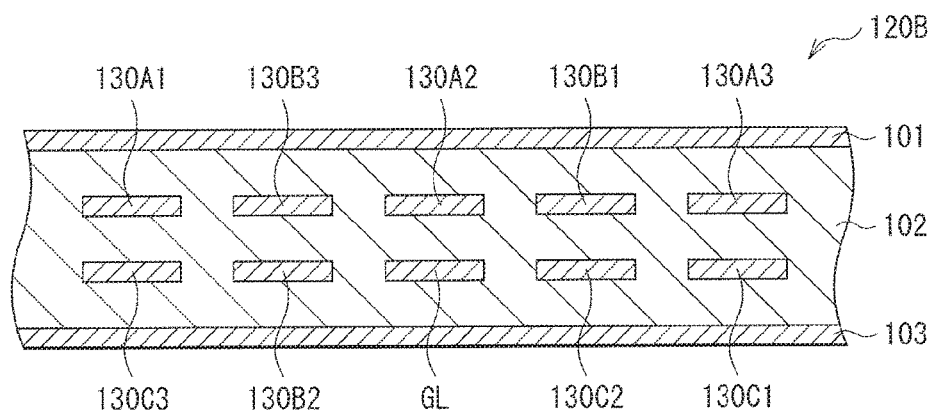

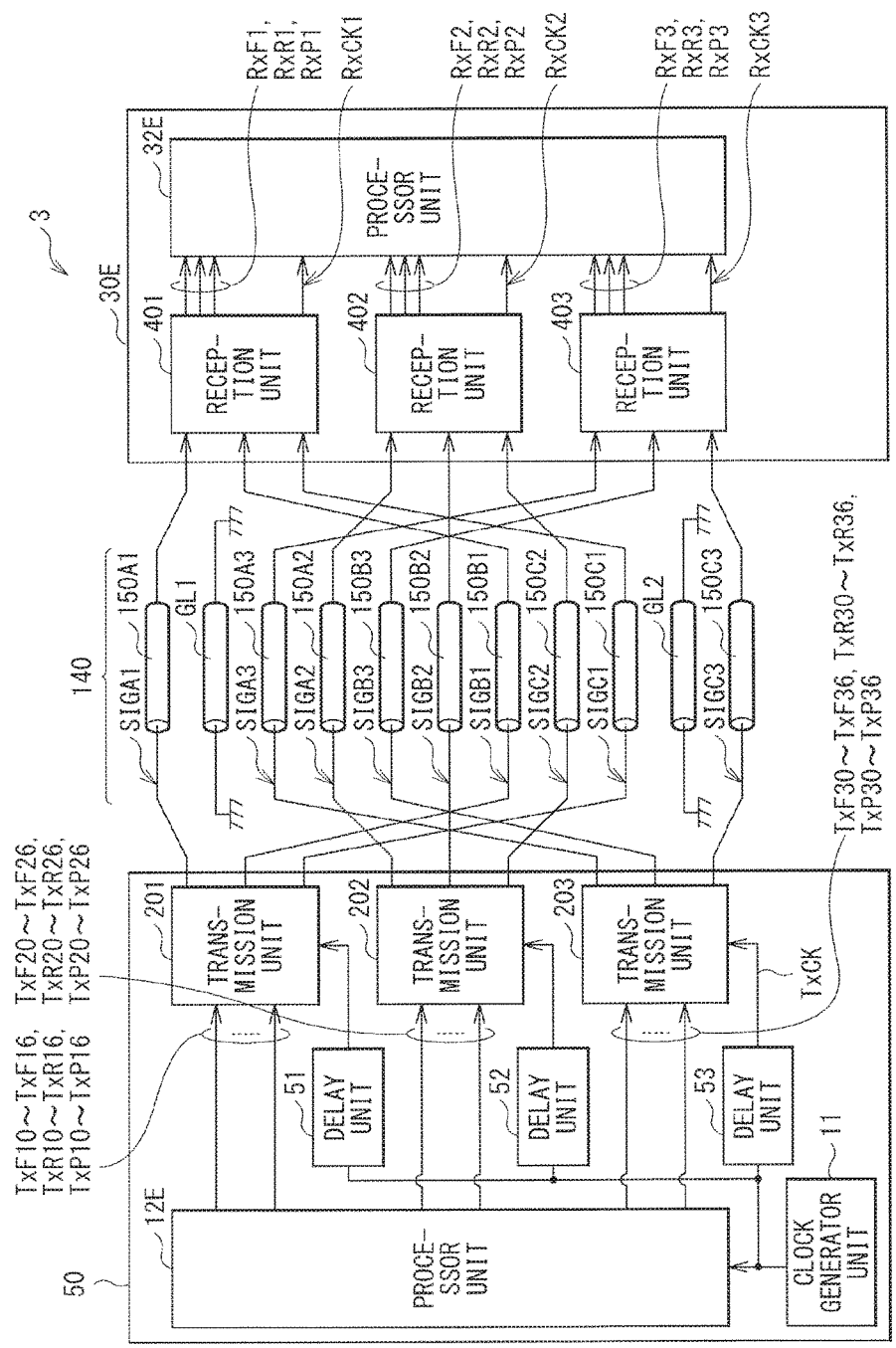
[FIG. 28]

[ FIG. 29 ]
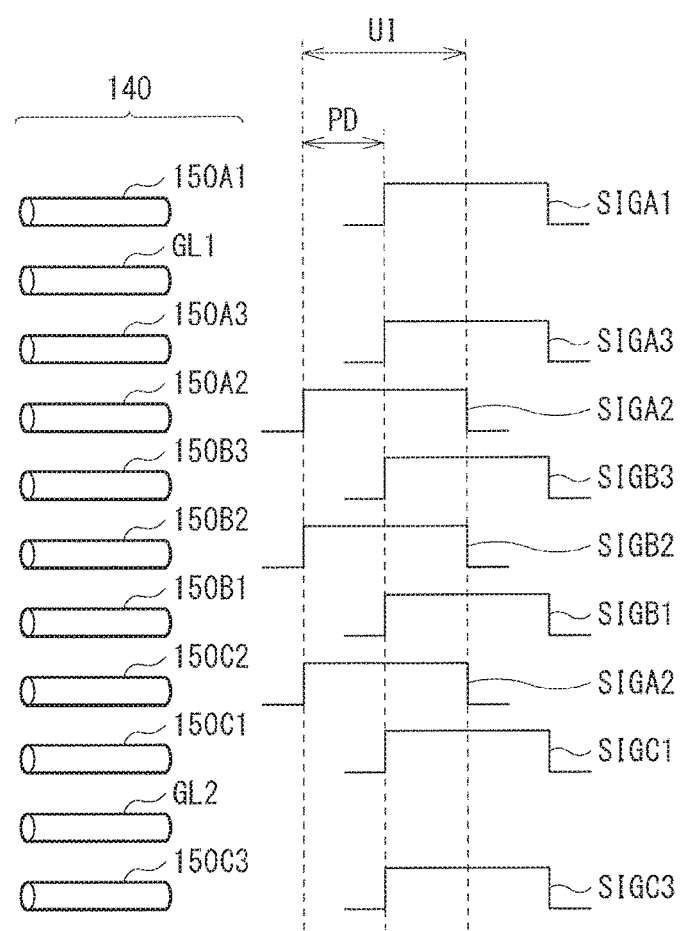

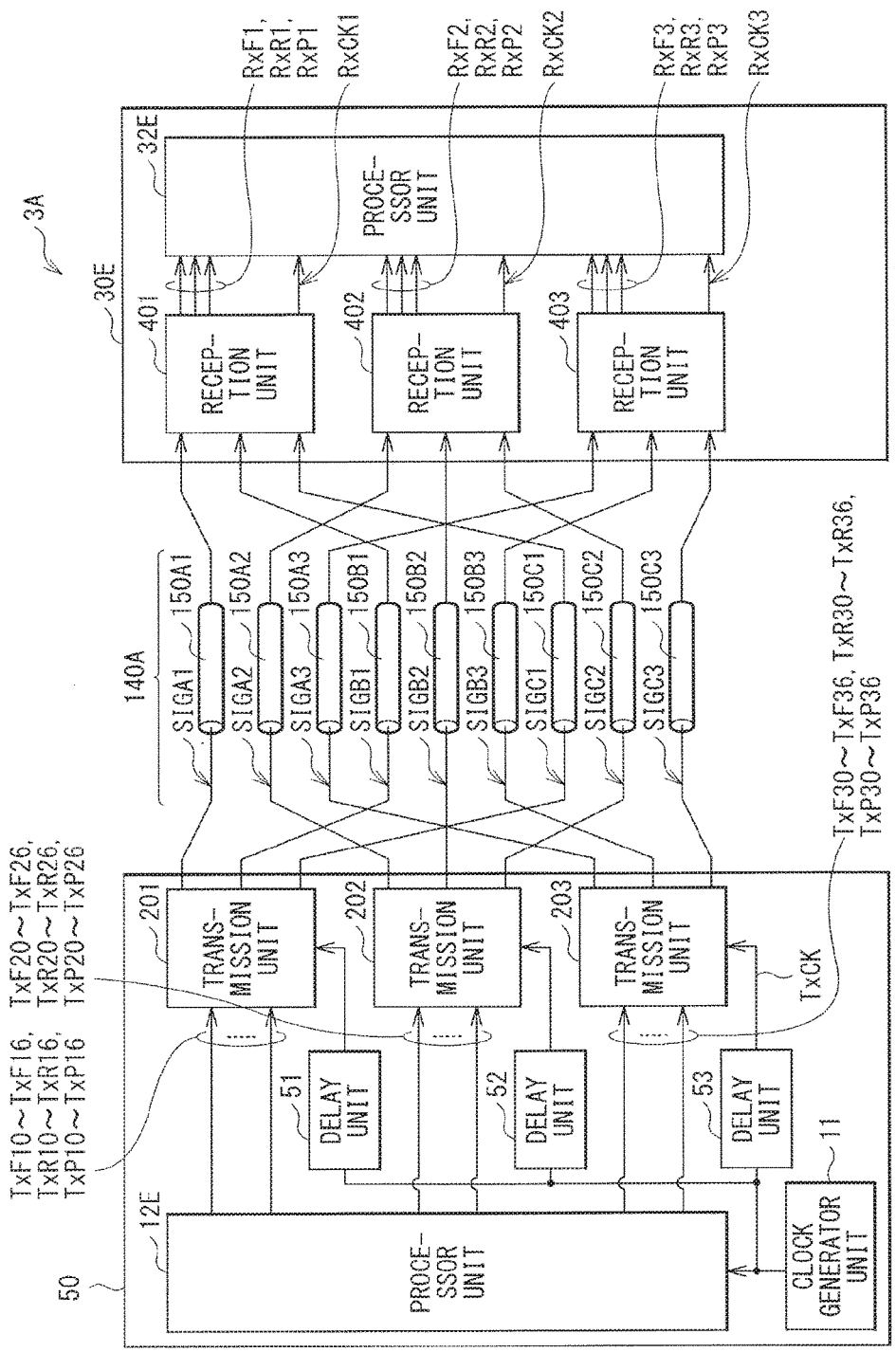
[FIG. 30]

[ FIG. 31 ]
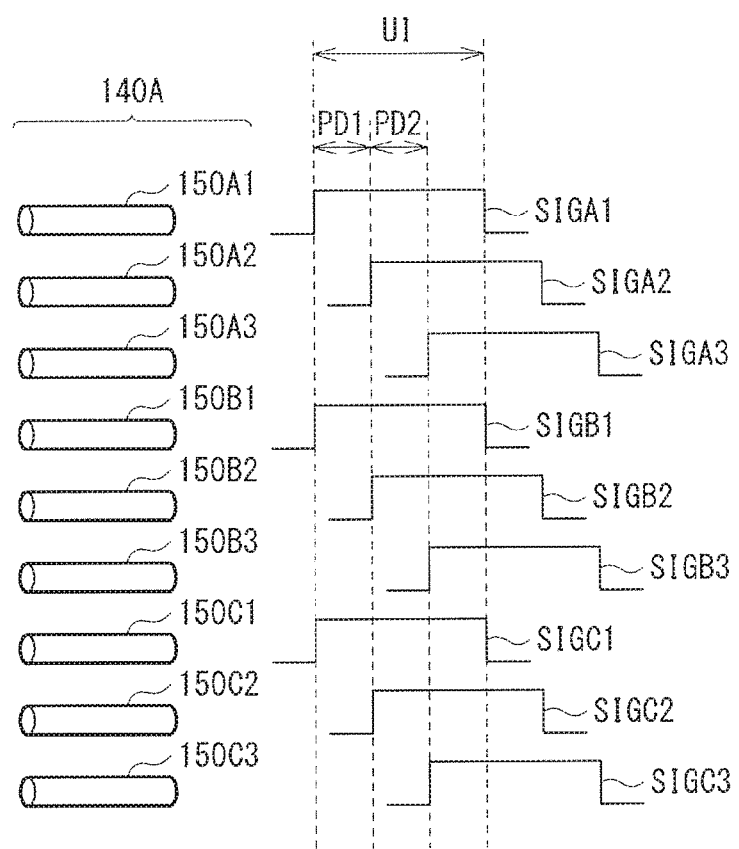

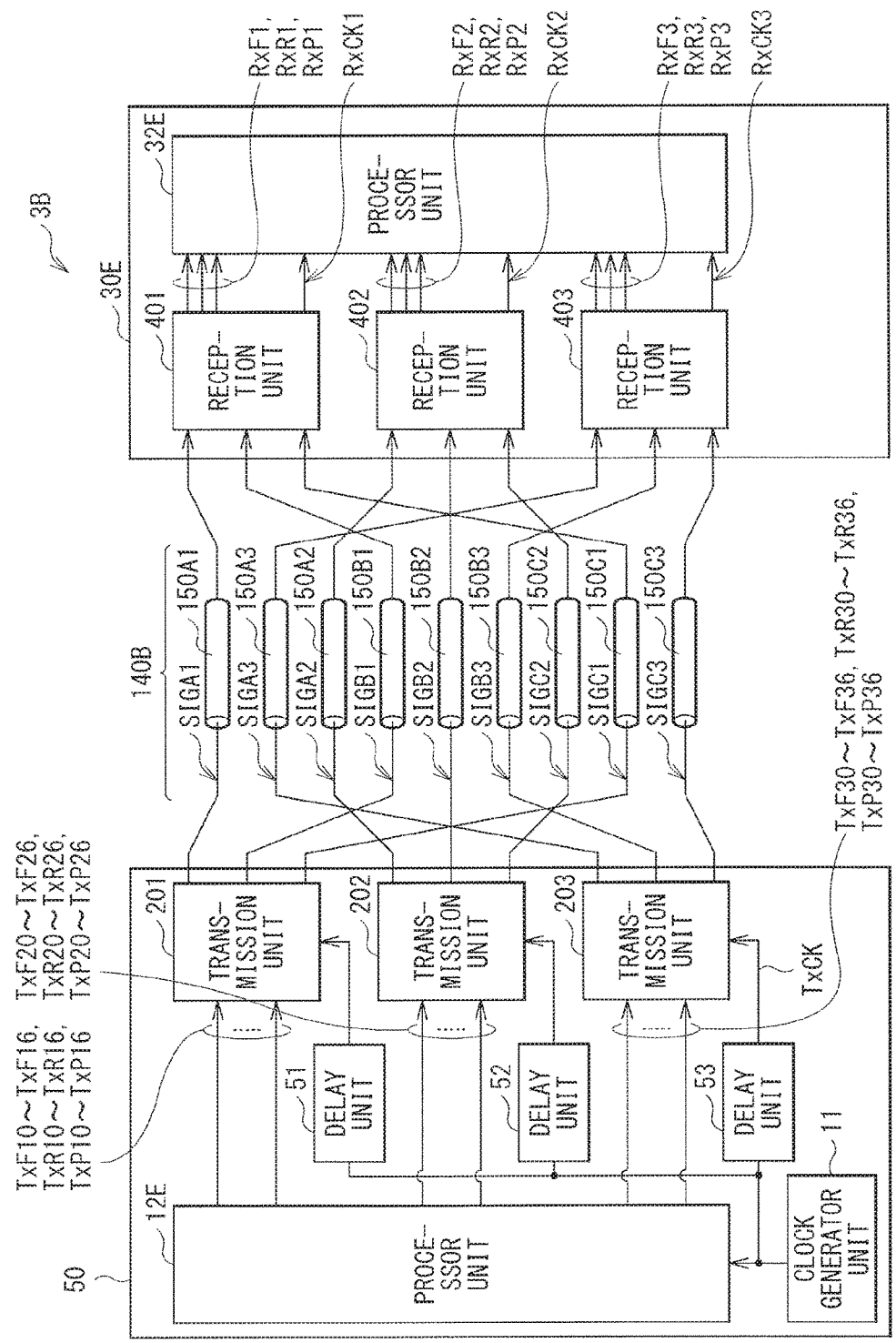
[FIG. 32]

[ FIG. 33 ]
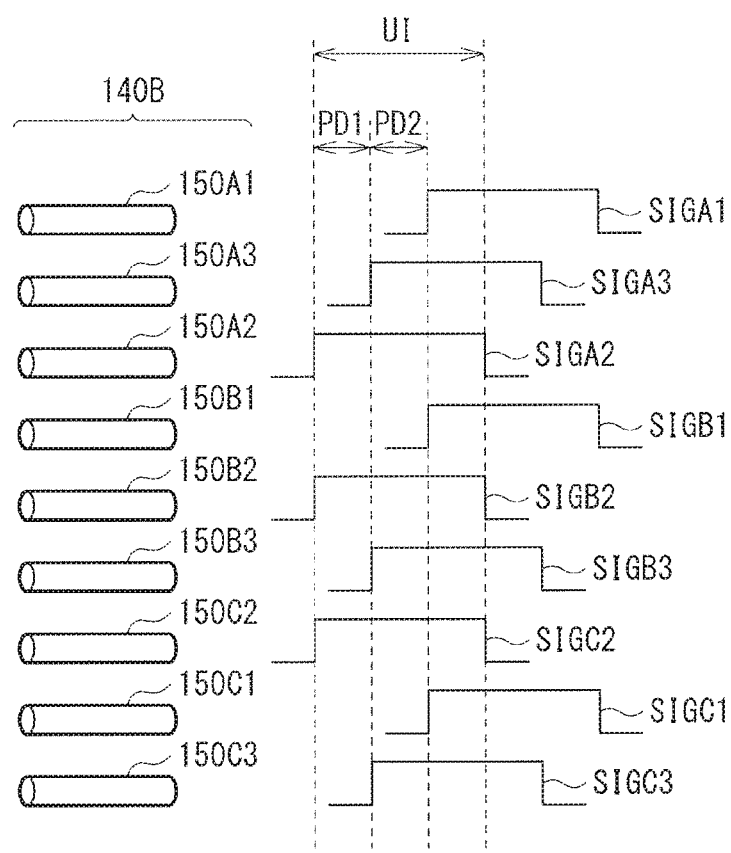

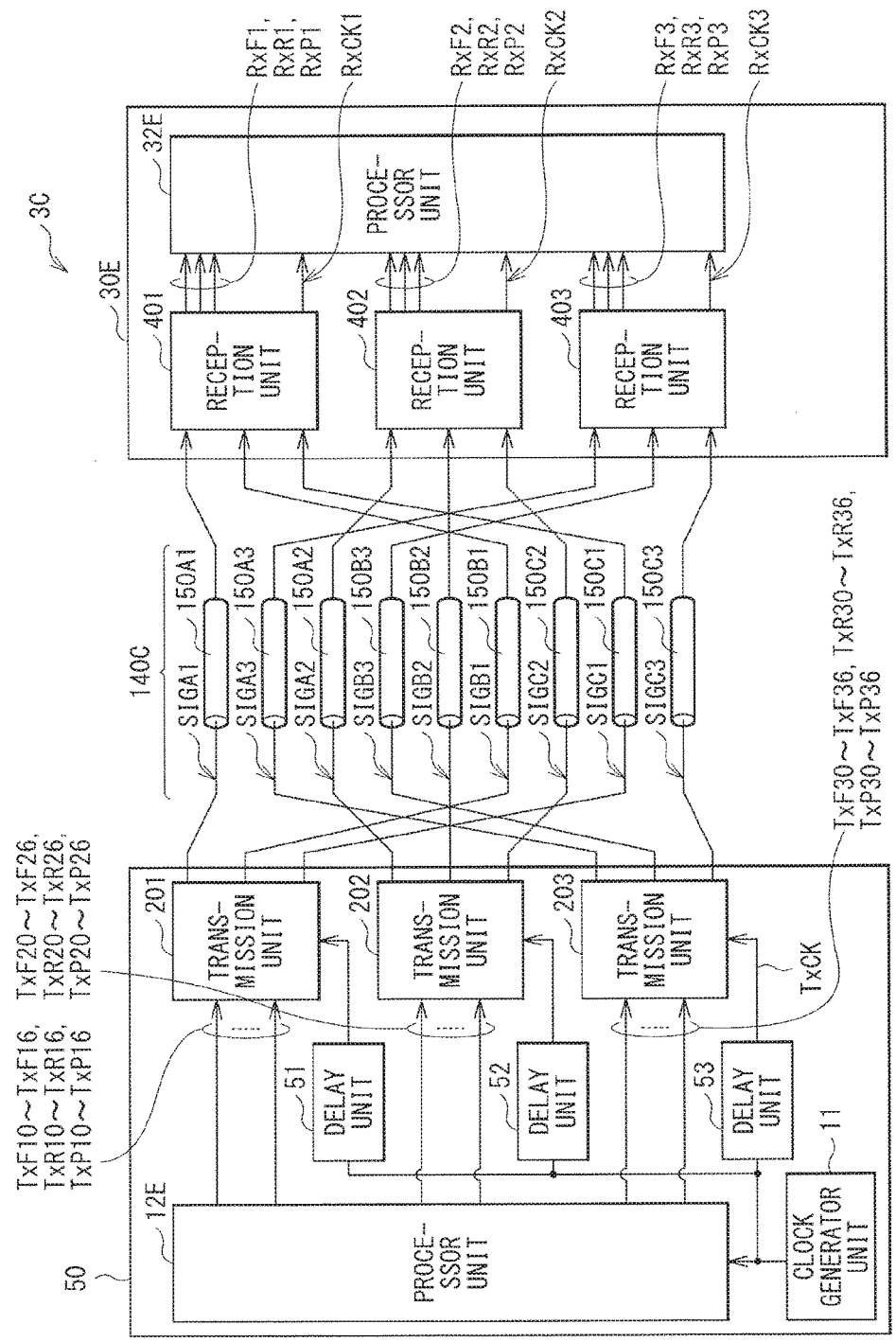
[FIG. 34]

[ FIG. 35 ]
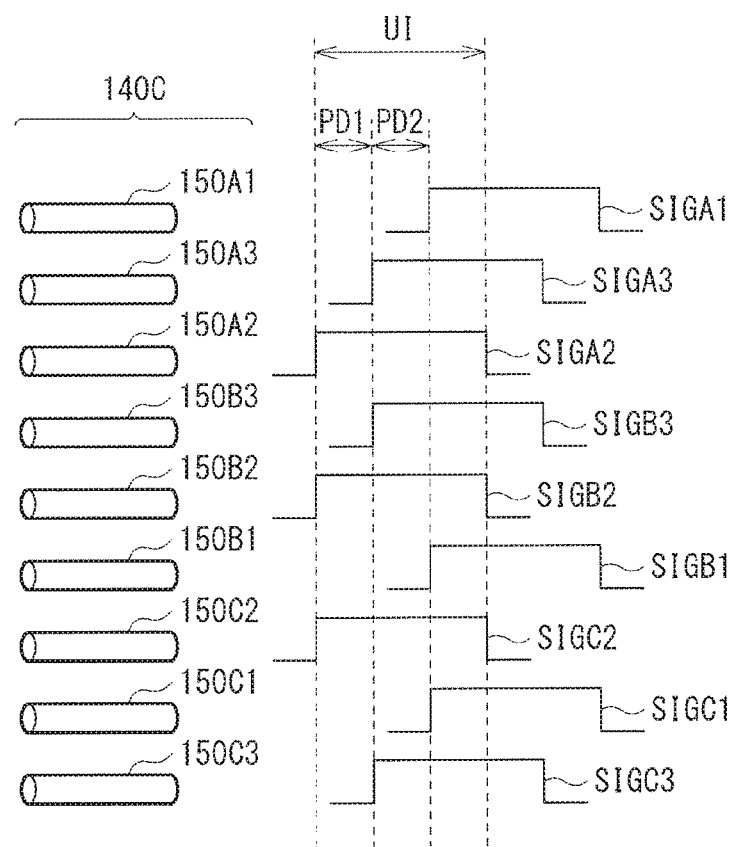

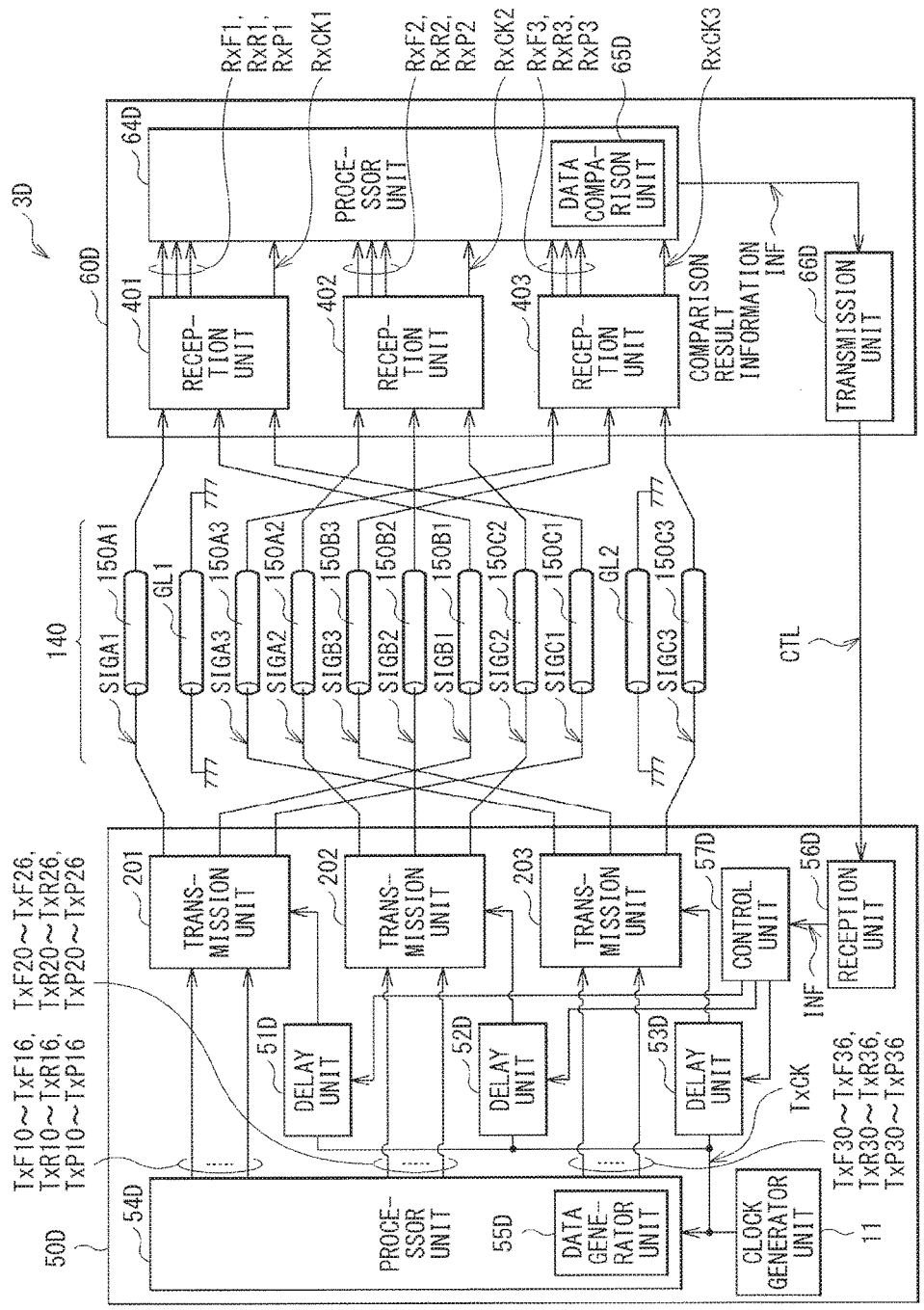
[ FIG. 36 ]

[ FIG. 37 ]
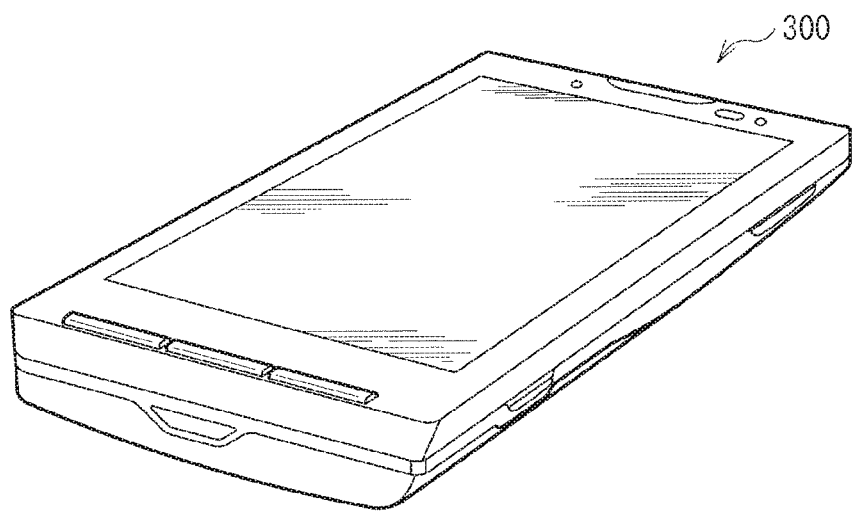

[ FIG. 38 ]
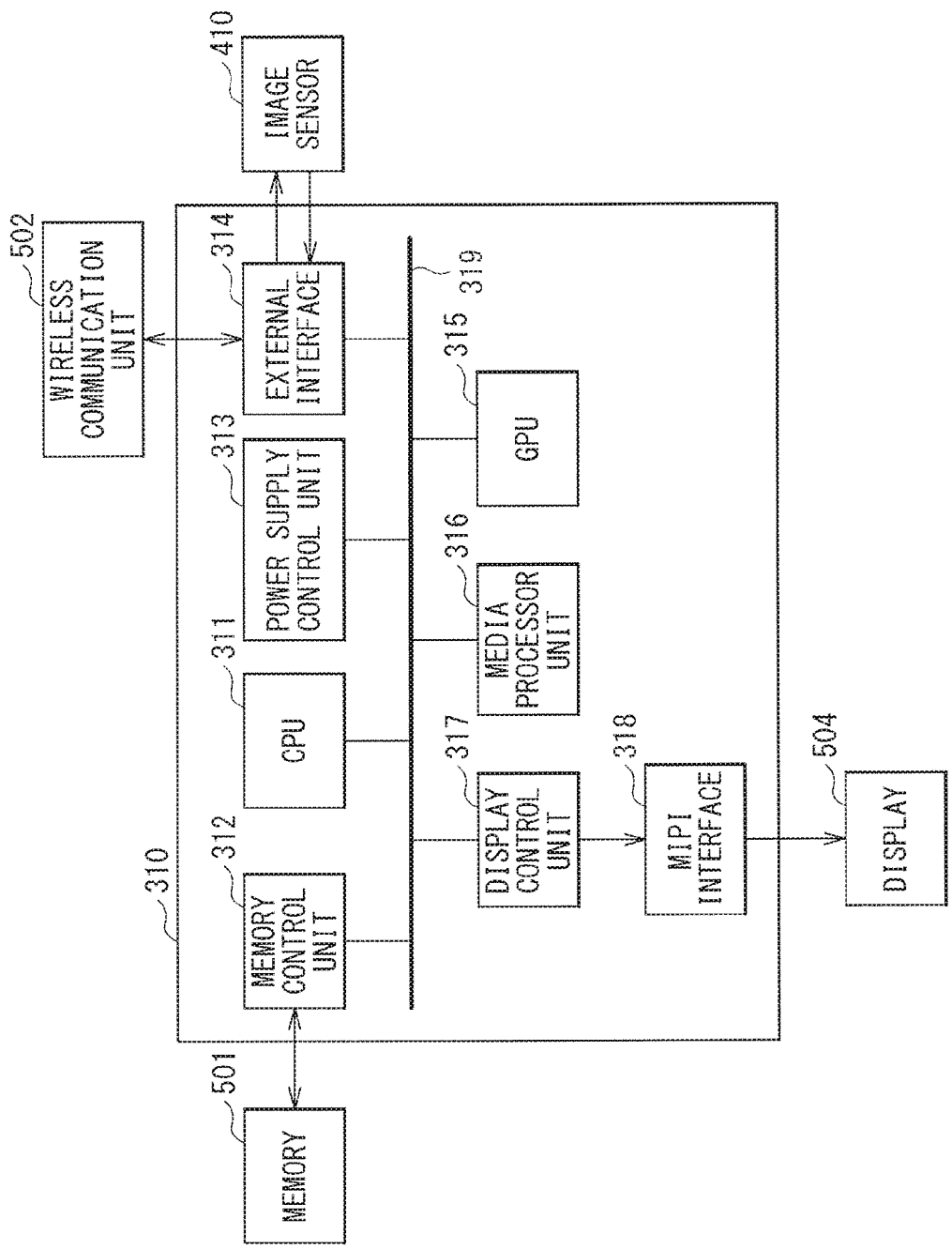

[ FIG. 39 ]
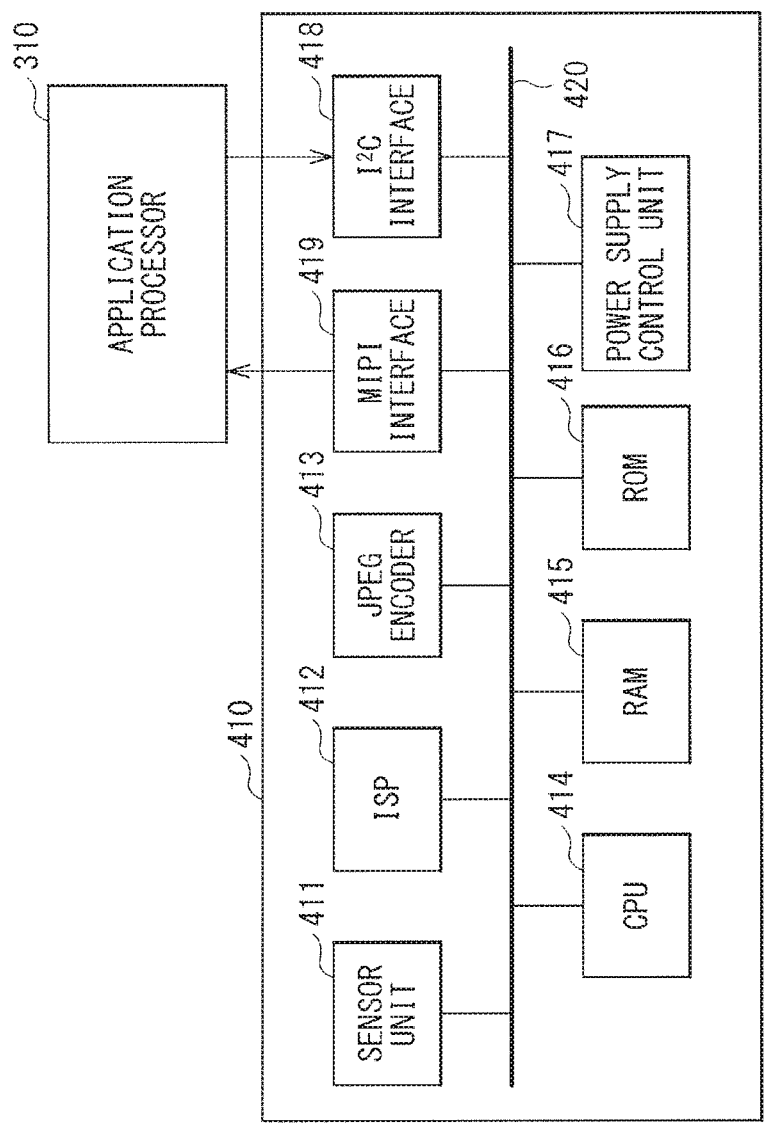

[ FIG. 40 ]
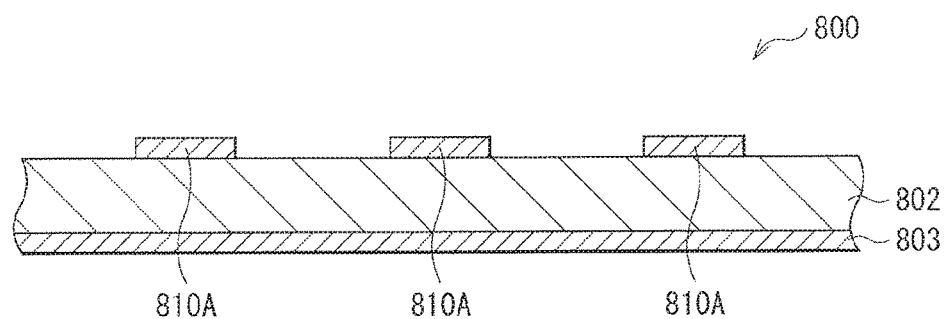
[ FIG. 41 ]
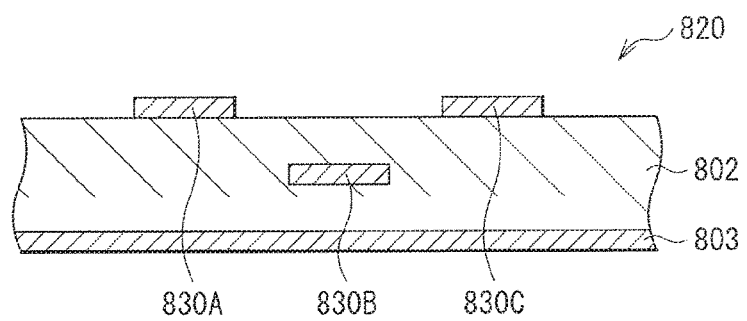

TRANSMISSION LINE

TECHNICAL FIELD

The disclosure relates to a transmission line that transmits signals.

BACKGROUND ART

With higher functionalization and multifunctionalization of electronic apparatuses in recent years, the electronic apparatuses are equipped with various devices such as semiconductor chips, sensors, and display devices. Among these devices, data exchange is performed in a large amount. The amount of data has been increasing in accordance with the higher functionalization and the multifunctionalization of the electronic apparatuses. Accordingly, the data exchange is often carried out with the utilization of a high-speed interface that is able to transmit and receive data at a speed of, for example, several Gbps.

Regarding methods of increasing transmission capacity even more, various techniques have been disclosed. For example, PTLs 1 and 2 disclose communication systems that transmit three differential signals with the utilization of three pieces of transmission lines.

Now, in communication systems, high communication quality is desired. Enhancing communication quality involves appropriate formation of, for example, a wiring pattern of transmission lines. For example, PTL 3 discloses a wiring pattern in a differential transmission line.

CITATION LIST

Patent Literature

PTL 1: Japanese Unexamined Patent Application Publication No. H06-261092
PTL 2: Specification of U.S. Pat. No. 8,064,535
PTL 3: Japanese Unexamined Patent Application Publication No. 2006-128618

SUMMARY OF THE INVENTION

As described, in communication systems, high communication quality is desired, with expectation of further enhancement in communication quality.

It is therefore desirable to provide a transmission line that makes it possible to enhance communication quality.

A first transmission line according to an embodiment of the disclosure includes a first line, a second line, and a third line. The second line has characteristic impedance higher than characteristic impedance of the first line. The first transmission line as mentioned above transmits a symbol that corresponds to a combination of signals in the first line, the second line, and the third line.

A second transmission line according to an embodiment of the disclosure includes a first line, a second line, and a third line. The first line is formed in a first layer. The second line is formed in a second layer. The third line is formed in the first layer. The second transmission line as mentioned above transmits a symbol that corresponds to a combination of signals in the first line, the second line, and the third line.

A third transmission line according to an embodiment of the disclosure includes a first trio line and a second trio line. The first trio line includes three lines and transmits a first symbol corresponding to a combination of signals. The second trio line includes three lines and transmits a second symbol corresponding to a combination of signals. One of the three lines in the second trio line is disposed between two of the three lines in the first trio line as mentioned above.

In the first transmission line according to the embodiment of the disclosure, provided are the first line, the second line, and the third line. The symbol corresponding to the combination of the signals in these lines is transmitted. The characteristic impedance of the second line is higher than the characteristic impedance of the first line.

In the second transmission line according to the embodiment of the disclosure, provided are the first line, the second line, and the third line. The symbol corresponding to the combination of the signals in these lines is transmitted. The first line and the third line are formed in the first layer, whereas the second line is formed in the second layer.

In the third transmission line according to the embodiment of the disclosure, provided are the first trio line and the second trio line. Moreover, in the first trio line, transmitted is the first symbol corresponding to the combination of the signals in the three lines. In the second trio line, transmitted is the second symbol corresponding to the combination of the signals in the three lines. One of the three lines in the second trio line is disposed between two of the three lines in the first trio line.

According to the first transmission line of the embodiment of the disclosure, the characteristic impedance of the second line is higher than the characteristic impedance of the first line. Hence, it is possible to enhance the communication quality.

According to the second transmission line of the embodiment of the disclosure, the first line and the third line are formed in the first layer, whereas the second line is formed in the second layer. Hence, it is possible to enhance the communication quality.

According to the third transmission line of the embodiment of the disclosure, one of the three lines in the second trio line is disposed between two lines out of the three lines in the first trio line. Hence, it is possible to enhance the communication quality.

It is to be noted that effects of the disclosure are not necessarily limited to the effects described above, and may include any of effects that are described herein.

BRIEF DESCRIPTION OF DRAWING

FIG. 1 is a block diagram that illustrates one configuration example of a communication system according to one example embodiment of the disclosure.

FIG. 2 is a descriptive diagram that illustrates voltage states of signals transmitted and received by the communication system illustrated in FIG. 1.

FIG. 3 is a descriptive diagram that illustrates transitions of symbols transmitted and received by the communication system illustrated in FIG. 1.

FIG. 4 is a block diagram that illustrates one configuration example of a transmission unit illustrated in FIG. 1.

FIG. 5 is a table that summarizes one operation example of an output unit illustrated in FIG. 4.

FIG. 6 is a block diagram that illustrates one configuration example of the output unit illustrated in FIG. 4.

FIG. 7 is a circuit diagram that illustrates one configuration example of a driver illustrated in FIG. 6.

FIG. 8 is a block diagram that illustrates one configuration example of a reception unit illustrated in FIG. 1.

FIG. 9 is a waveform chart that illustrates one example of signals transmitted and received by the communication system illustrated in FIG. 1.

FIG. 10 is a descriptive diagram that illustrates one example of reception operation of the reception unit illustrated in FIG. 8.

FIG. 11 is a cross-sectional view of one configuration example of a transmission line according to a first embodiment.

FIG. 12 is a characteristic diagram that illustrates one characteristic example of the transmission line illustrated in FIG. 11.

FIG. 13 is a characteristic diagram that illustrates another characteristic example of the transmission line illustrated in FIG. 11.

FIG. 14 is a characteristic diagram that illustrates one characteristic example of a transmission line according to a comparative example.

FIG. 15 is a characteristic diagram that illustrates another characteristic example of the transmission line according to the comparative example.

FIG. 16 is a cross-sectional view of one configuration example of a transmission line according to a modification example of the first embodiment.

FIG. 17 is a cross-sectional view of one configuration example of a transmission line according to another modification example of the first embodiment.

FIG. 18 is a cross-sectional view of one configuration example of a transmission line according to another modification example of the first embodiment.

FIG. 19 is a block diagram that illustrates one configuration example of a communication system according to another modification example of the first embodiment.

FIG. 20 is a descriptive diagram that illustrates one configuration example of a transmission line illustrated in FIG. 19.

FIG. 21 is a table that summarizes one characteristic example of the transmission line illustrated in FIG. 20.

FIG. 22 is a table that summarizes another characteristic example of the transmission line illustrated in FIG. 19.

FIG. 23 is a descriptive diagram that illustrates one configuration example of a transmission line according to another modification example of the first embodiment.

FIG. 24 is a cross-sectional view of one configuration example of a transmission line according to a second embodiment.

FIG. 25 is a block diagram that illustrates one configuration example of a communication system according to a modification example of the second embodiment.

FIG. 26 is a cross-sectional view of one configuration example of a transmission line illustrated in FIG. 25.

FIG. 27 is a cross-sectional view of one configuration example of a transmission line according to another modification example of the second embodiment.

FIG. 28 is a block diagram that illustrates one configuration example of a communication system according to a third embodiment.

FIG. 29 is a schematic diagram that illustrates one operation example of the communication system illustrated in FIG. 28.

FIG. 30 is a block diagram that illustrates one configuration example of a communication system according to a modification example of the third embodiment.

FIG. 31 is a schematic diagram that illustrates one operation example of the communication system illustrated in FIG. 30.

FIG. 32 is a block diagram that illustrates one configuration example of a communication system according to another modification example of the third embodiment.

FIG. 33 is a schematic diagram that illustrates one operation example of the communication system illustrated in FIG. 32.

FIG. 34 is a block diagram that illustrates one configuration example of a communication system according to another modification example of the third embodiment.

FIG. 35 is a schematic diagram that illustrates one operation example of the communication system illustrated in FIG. 34.

FIG. 36 is a block diagram that illustrates one configuration example of a communication system according to another modification example of the third embodiment.

FIG. 37 is a perspective view of an external appearance and a configuration of a smartphone to which the communication system according to the example embodiment is applied.

FIG. 38 is a block diagram that illustrates one configuration example of an application processor to which the communication system according to the example embodiment is applied.

FIG. 39 is a block diagram that illustrates one configuration example of an image sensor to which the communication system according to the example embodiment is applied.

FIG. 40 is a cross-sectional view of one configuration example of a transmission line according to a modification example.

FIG. 41 is a cross-sectional view of one configuration example of a transmission line according to another modification example.

MODES FOR CARRYING OUT THE INVENTION

In the following, some embodiments of the disclosure are described in detail with reference to the drawings. It is to be noted that description is made in the following order.
1. First Embodiment
2. Second Embodiment
3. Third Embodiment
4. Application Example

[1. First Embodiment]
[Configuration Example]

FIG. 1 illustrates one configuration example of a communication system including a transmission line according to a first embodiment. A communication system 1 performs communication with the utilization of a signal having three voltage levels.

The communication system 1 includes a transmission device 10, a transmission line 100, and a reception device 30. The transmission device 10 includes three output terminals ToutA, ToutB, and ToutC. The transmission line 100 includes lines 110A, 110B, and 110C. The reception device 30 includes three input terminals TinA, TinB, and TinC. Moreover, the output terminal ToutA of the transmission device 10 and the input terminal TinA of the reception device 30 are coupled to each other through the line 110A. The output terminal ToutB of the transmission device 10 and the input terminal TinB of the reception device 30 are coupled to each other through the line 110B. The output terminal ToutC of the transmission device 10 and the input terminal TinC of the reception device 30 are coupled to each other through the line 110C. Characteristic impedance of the lines 110A to 110C is about 50 [Ω] in this example. Specifically, as described later, the characteristic impedance of the line 110B is higher than the characteristic impedance of the lines 110A and 110C. Hence, in the communication system 1, as described later, it is possible to enhance communication quality.

The transmission device 10 outputs a signal SIGA from the output terminal ToutA, outputs a signal SIGB from the output terminal ToutB, and outputs a signal SIGC from the output terminal ToutC. Moreover, the reception device 30 receives the signal SIGA through the input terminal TinA, receives the signal SIGB through the input terminal TinB, and receives the signal SIGC through the input terminal TinC. The signals SIGA, SIGB, and SIGC each make transitions among the three voltage levels (a high level voltage VH, a medium level voltage VM, and a low level voltage VL).

FIG. 2 illustrates voltage states of the signals SIGA, SIGB, and SIGC. The transmission device 10 transmits six symbols "+x", "-x", "+y", "-y", "+z", and "-z" with the utilization of the three signals SIGA, SIGB, and SIGC. For example, in a case of the transmission of the symbol "+x", the transmission device 10 brings the signal SIGA to the high level voltage VH, brings the signal SIGB to the low level voltage VL, and brings the signal SIGC to the medium level voltage VM. In a case of the transmission of the symbol "-x", the transmission device 10 brings the signal SIGA to the low level voltage VL, brings the signal SIGB to the high level voltage VH, and brings the signal SIGC to the medium level voltage VM. In a case of the transmission of the symbol "+y", the transmission device 10 brings the signal SIGA to the medium level voltage VM, brings the signal SIGB to the high level voltage VH, and brings the signal SIGC to the low level voltage VL. In a case of the transmission of the symbol "-y", the transmission device 10 brings the signal SIGA to the medium level voltage VM, brings the signal SIGB to the low level voltage VL, and brings the signal SIGC to the high level voltage VH. In a case of the transmission of the symbol "+z", the transmission device 10 brings the signal SIGA to the low level voltage VL, brings the signal SIGB to the medium level voltage VM, and brings the signal SIGC to the high level voltage VH. In a case of the transmission of the symbol "-z", the transmission device 10 brings the signal SIGA to the high level voltage VH, brings the signal SIGB to the medium level voltage VM, and brings the signal SIGC to the low level voltage VL.

The transmission line 100 transmits a sequence of the symbols, with the utilization of the signals SIGA, SIGB, and SIGC as mentioned above. Specifically, the transmission line 100 transmits the sequence of the symbols, with the line 110A transmitting the signal SIGA, with the line 110B transmitting the signal SIGB, and with the line 110C transmitting the signal SIGC. In other words, the three lines 110A, 110B, and 110C serve as a single trio line that transmits the sequence of the symbols.

[Transmission Device 10]

Referring to FIG. 1, the transmission device 10 includes a clock generator unit 11, a processor unit 12, and a transmission unit 20.

The clock generator unit 11 generates a clock signal TxCK. A frequency of the clock signal TxCK is, for example, 2.5 [GHz]. The clock generator unit 11 is constituted by, for example, a PLL (Phase Locked Loop), and generates the clock signal TxCK on the basis of, for example, a reference clock (not illustrated) supplied from outside of the transmission device 10. Moreover, the clock generator unit 11 supplies the clock signal TxCK to the processor unit 12 and the transmission unit 20.

The processor unit 12 performs predetermined processing, and thereby generates transition signals TxF0 to TxF6, TxR0 to TxR6, and TxP0 to TxP6. Here, a single set of the transition signals TxF0, TxR0, and TxP0 indicates a transition of the symbol in the sequence of the symbols to be transmitted by the transmission device 10. Likewise, a single set of the transition signals TxF1, TxR1, and TxP1 indicates the transition of the symbol. A single set of the transition signals TxF2, TxR2, and TxP2 indicates the transition of the symbol. A single set of the transition signals TxF3, TxR3, and TxP3 indicates the transition of the symbol. A single set of the transition signals TxF4, TxR4, and TxP4 indicates the transition of the symbol. A single set of the transition signals TxF5, TxR5, and TxP5 indicates the transition of the symbol. A single set of the transition signals TxF6, TxR6, and TxP6 indicates the transition of the symbol. In other words, the processor unit 12 generates seven sets of the transition signals. In the following, the term "transition signal TxF" is utilized, as appropriate, to denote any one of the transition signals TxF0 to TxF6. The term "transition signal TxR" is utilized, as appropriate, to denote any one of the transition signals TxR0 to TxR6. The term "transition signal TxP" is utilized, as appropriate, to denote any one of the transition signals TxP0 to TxP6.

FIG. 3 illustrates relation between the transition signals TxF, TxR, and TxP, and the transitions of the symbol. A three-digit numerical value assigned to each of the transitions indicates values of the transition signals TxF, TxR, and TxP in the order named.

The transition signal TxF (Flip) allows the symbol to make the transition between "+x" and "-x", allows the symbol to make the transition between "+y" and "-y", and allows the symbol to make the transition between "+z" and "-z". Specifically, in a case in which the transition signal TxF is "1", the transition is made so as to change polarity of the symbol (e.g., from "+x" to "-x"). In a case in which the transition signal TxF is "0", no such transition is made.

The transition signals TxR (Rotation) and TxP (Polarity) allow the symbol to make the transition between "+x" and other than "-x", between "+y" and other than "-y", or "+z" and other than "-z", in a case in which the transition signal TxF is "0". Specifically, in a case in which the transition signals TxR and TxP are respectively "1" and "0", the transition is made in a clockwise direction (e.g., from "+x" to "+y") in FIG. 3, with the polarity of the symbol being maintained. In a case in which the transition signals TxR and TxP are respectively "1" and "1", the transition is made in the clockwise direction (e.g., from "+x" to "-y") in FIG. 3, with the polarity of the symbol being changed. Moreover, in a case in which the transition signals TxR and TxP are respectively "0" and "0", the transition is made in a counterclockwise direction (e.g., from "+x" to "+z") in FIG. 3, with the polarity of the symbol being maintained. In a case in which the transition signals TxR and TxP are respectively "0" and "1", the transition is made in the counterclockwise direction (e.g., from "+x" to "-z") in FIG. 3, with the polarity of the symbol being changed.

The processor unit 12 generates the seven sets of the transition signals TxF, TxR, and TxP as described. Moreover, the processor unit 12 supplies the seven sets of the transition signals TxF, TxR, and TxP (the transition signals TxF0 to TxF6, TxR0 to TxR6, and TxP0 to TxP6) to the transmission unit 20.

The transmission unit 20 generates the signals SIGA, SIGB, and SIGC, on the basis of the transition signals TxF0 to TxF6, TxR0 to TxR6, and TxP0 to TxP6.

FIG. 4 illustrates one configuration example of the transmission unit 20. The transmission unit 20 includes serializers 21 to 23, a transmission symbol generator unit 24, and an output unit 27.

The serializer 21 serializes the transition signals TxF0 to TxF6 in this order, on the basis of the transition signals TxF0 to TxF6 and on the basis of the clock signal TxCK, to generate a transition signal TxF9. The serializer 22 serializes the transition signals TxR0 to TxR6 in this order, on the basis of the transition signals TxR0 to TxR6 and on the basis of the clock signal TxCK, to generate a transition signal TxR9. The serializer 23 serializes the transition signals TxP0 to TxP6 in this order, on the basis of the transition signals TxP0 to TxP6 and on the basis of the clock signal TxCK, to generate a symbol signal TxP9.

The transmission symbol generator unit 24 generates symbol signals Tx1, Tx2, and Tx3, on the basis of the transition signals TxF9, TxR9, and TxP9 and on the basis of the clock signal TxCK. The transmission symbol generator unit 24 includes a signal generator unit 25 and a flip flop 26.

The signal generator unit 25 generates the symbol signals Tx1, Tx2, and Tx3, on the basis of the transition signals TxF9, TxR9, and TxP9 and on the basis of symbol signals D1, D2, and D3. Specifically, the signal generator unit 25 obtains a symbol after the transition, as illustrated in FIG. 3, on the basis of a symbol indicated by the symbol signals D1, D2, and D3 (a pre-transition symbol) and on the basis of the transition signals TxF9, TxR9, and TxP9. The signal generator unit 25 outputs the symbol after the transition as the symbol signals Tx1, Tx2, and Tx3.

The flip flop 26 performs samplings of the symbol signals Tx1, Tx2, and Tx3 on the basis of the clock signal TxCK, and outputs results of the samplings as the symbol signals D1, D2, and D3, respectively.

The output unit 27 generates the signals SIGA, SIGB, and SIGC on the basis of the symbol signals Tx1, Tx2, and Tx3 and on the basis of the clock signal TxCK.

FIG. 5 illustrates one operation example of the output unit 27. For example, in a case where the symbol signals Tx1, Tx2, and Tx3 are "1", "0", and "0", the output unit 27 brings the signal SIGA to the high level voltage VH, brings the signal SIGB to the low level voltage VL, and brings the signal SIGC to the medium level voltage VM. In other words, the output unit 27 generates the symbol "+x". Moreover, for example, in a case where the symbol signals Tx1, Tx2, and Tx3 are "0", "1", and "1", the output unit 27 brings the signal SIGA to the low level voltage VL, brings the signal SIGB to the high level voltage VH, and brings the signal SIGC to the medium level voltage VM. In other words, the output unit 27 generates the symbol "−x". Moreover, for example, in a case where the symbol signals Tx1, Tx2, and Tx3 are "0", "1", and "0", the output unit 27 brings the signal SIGA to the medium level voltage VM, brings the signal SIGB to the high level voltage VH, and brings the signal SIGC to the low level voltage VL. In other words, the output unit 27 generates the symbol "+y". Moreover, for example, in a case where the symbol signals Tx1, Tx2, and Tx3 are "1", "0", and "1", the output unit 27 brings the signal SIGA to the medium level voltage VM, brings the signal SIGB to the low level voltage VL, and brings the signal SIGC to the high level voltage VH. In other words, the output unit 27 generates the symbol "−y". Moreover, for example, in a case where the symbol signals Tx1, Tx2, and Tx3 are "0", "0", and "1", the output unit 27 brings the signal SIGA to the low level voltage VL, brings the signal SIGB to the medium level voltage VM, and brings the signal SIGC to the high level voltage VH. In other words, the output unit 27 generates the symbol "+z". Moreover, for example, in a case where the symbol signals Tx1, Tx2, and Tx3 are "1", "1", and "0", the output unit 27 brings the signal SIGA to the high level voltage VH, brings the signal SIGB to the medium level voltage VM, and brings the signal SIGC to the low level voltage VL. In other words, the output unit 27 generates the symbol "−z".

FIG. 6 illustrates one configuration example of the output unit 27. The output unit 27 includes a driver control unit 28 and driver units 29A, 29B, and 29C.

The driver control unit 28 generates control signals PU1A to PU5A, PD1A to PD5A, PU1B to PU5B, PD1B to PD5B, PU1C to PU5C, and PD1C to PD5C, on the basis of the symbol signals Tx1, Tx2, and Tx3 and on the basis of the clock signal TxCK. Moreover, the driver control unit 28 supplies the control signals PU1A to PU5A and PD1A to PD5A to the driver unit 29A, supplies the control signals PU1B to PU5B and PD1B to PD5B to the driver unit 29B, and supplies the control signals PU1C to PU5C and PD1C to PD5C to the driver unit 29C.

The driver unit 29A generates the signal SIGA on the basis of the control signals PU1A to PU5A and PD1A to PD5A. The driver unit 29A includes, in this example, five drivers 291A to 295A. The drivers 291A to 295A each set a voltage of the output terminal ToutA on the basis of a signal supplied to a positive input terminal and on a basis of a signal supplied to a negative input terminal. The driver 291A includes the positive input terminal supplied with the control signal PU1A, the negative input terminal supplied with the control signal PD1A, and an output terminal coupled to the output terminal ToutA of the transmission device 10. The driver 292A includes the positive input terminal supplied with the control signal PU2A, the negative input terminal supplied with the control signal PD2A, and an output terminal coupled to the output terminal ToutA of the transmission device 10. The driver 293A includes the positive input terminal supplied with the control signal PU3A, the negative input terminal supplied with the control signal PD3A, and an output terminal coupled to the output terminal ToutA of the transmission device 10. The driver 294A includes the positive input terminal supplied with the control signal PU4A, the negative input terminal supplied with the control signal PD4A, and an output terminal coupled to the output terminal ToutA of the transmission device 10. The drive 295A includes the positive input terminal supplied with the control signal PU5A, the negative input terminal supplied with the control signal PD5A, and an output terminal coupled to the output terminal ToutA of the transmission device 10. In this way, the output terminals of the drivers 291A to 295A are coupled to one another and are coupled to the output terminal ToutA.

The driver unit 29B generates the signal SIGB on the basis of the control signals PU1B to PU5B and PD1B to PD5B. The driver unit 29B includes, in this example, five drivers 291B to 295B. The driver 291B includes the positive input terminal supplied with the signal PU1B, the negative input terminal supplied with the signal PD1B, and an output terminal coupled to the output terminal ToutB of the transmission device 10. The same applies to the drivers 292B to 295B. In this way, the output terminals of the drivers 291B to 295B are coupled to one another and are coupled to the output terminal ToutB.

The driver unit 29C generates the signal SIGC on the basis of the control signals PU1C to PU5C and PD1C to PD5C. The driver unit 29C includes, in this example, five drivers 291C to 295C. The driver 291C includes the positive input terminal supplied with the signal PU1C, the negative input terminal supplied with the signal PD1C, and an output terminal coupled to the output terminal ToutC of the transmission device 10. The same applies to the drivers 292C to 295C. In this way, the output terminals of the drivers 291C to 295C are coupled to one another and are coupled to the output terminal ToutC.

FIG. 7 illustrates one configuration example of the driver 291A. It is to be noted that the same applies to the drivers 292A to 295A, 291B to 295B, and 291C to 295C. The driver 291A includes transistors 91 and 94, and resistors 92 and 93. The transistors 91 and 94 are, in this example, N channel MOS (Metal Oxide Semiconductor) FET (Field Effect Transistor). The transistor 91 includes a gate that corresponds to the positive input terminal of the driver 291A and is supplied with the control signal PU1A, a drain supplied with a voltage V1, and a source coupled to one end of the resistor 92. The transistor 94 includes a gate that corresponds to the negative input terminal of the driver 291A and is supplied with the control signal PD1A, a drain coupled to one end of the resistor 93, and a source that is grounded. The resistor 92 includes the one end coupled to the source of the transistor 91, and another end coupled to another end of the resistor 93 and coupled to the output terminal ToutA of the transmission device 10. The resistor 93 includes the one end coupled to the drain of the transistor 94, and the other end coupled to the other end of the resistor 92 and coupled to the output terminal ToutA of the transmission device 10. In this example, a sum of ON resistance of the transistor 91 and a resistance value of the resistor 92 is about 200 [Ω]. Likewise, a sum of ON resistance of the transistor 94 and a resistance value of the resistor 93 is about 200 [Ω].

With this configuration, the driver control unit 28 sets the voltage of the output terminal ToutA at one of the three voltages (the high level voltage VH, the low level voltage VL, and the medium level voltage VM) with the utilization of the control signals PU1A to PU5A and PD1A to PD5A. Specifically, for example, in a case where the voltage of the output terminal ToutA is to be set at the high level voltage VH, for example, four out of the control signals PU1A to PU5A are set at "1", while a remaining one and the control signals PD1A to PD5A are set at "0". Thus, in the driver unit 29A, the four transistors 91 whose gates are supplied with "1" are turned on. As a result, the signal SIGA is brought to the high level voltage VH, while output termination resistance of the driver unit 29A is brought to about 50 [Ω]. Moreover, for example, in a case where the voltage of the output terminal ToutA is to be set at the low level voltage VL, for example, four out of the control signals PD1A to PD5A are set at "1", while a remaining one and the control signals PU1A to PU5A are set at "0". Thus, in the driver unit 29A, the four transistors 94 whose gates are supplied with "1" are turned on. As a result, the signal SIGA is brought to the low level voltage VL, while the output termination resistance of the driver unit 29A is brought to about 50 [Ω]. Moreover, in a case where the voltage of the output terminal ToutA is to be set at the medium level voltage VM, for example, two out of the control signals PU1A to PU5A are set at "1", with remaining ones being set at "0", while for example, two out of the control signals PD1A to PD5A are set at "1", with remaining ones being set at "0". Thus, in the driver unit 291A, the two transistors 91 and the two transistors 94 whose gates are supplied with "1" are turned on, which provides Thevenin termination. As a result, the signal SIGA is brought to the medium level voltage VM, while the output termination resistance of the driver unit 29A is brought to about 50 [Ω]. In this way, the driver control unit 28 sets the voltage of the output terminal ToutA at one of the three voltages with the utilization of the control signals PU1A to PU5A and PD1A to PD5A.

[Reception Device 40]

As illustrated in FIG. 1, the reception device 30 includes the reception unit 40 and a processor unit 32.

The reception unit 40 receives the signals SIGA, SIGB, and SIGC, and generates transition signals RxF, RxR, and RxP and a clock signal RxCK on the basis of the signals SIGA, SIGB, and SIGC.

FIG. 8 illustrates one configuration example of the reception unit 40. The reception unit 40 includes resistors 41A, 41B, and 41C, amplifiers 42A, 42B, and 42C, a clock generator unit 43, flip flops 44 and 45, and a signal generator unit 46.

The resistors 41A, 41B, and 41C function as termination resistance in the communication system 1. The resistor 41A includes one end that is coupled to the input terminal TinA and is supplied with the signal SIGA, and another end that is coupled to another end of the resistor 41B and is coupled to another end of the resistor 41C. The resistor 41B includes one end that is coupled to the input terminal TinB and is supplied with the signal SIGB, and the other end that is coupled to the other end of the resistor 41A and is coupled to the other end of the resistor 41C. The resistor 41C includes one end that is coupled to the input terminal TinC and is supplied with the signal SIGC, and the other end that is coupled to the other end of the resistor 41A and is coupled to the other end of the resistor 41B.

The amplifiers 42A, 42B, and 42C each output a signal that corresponds to a difference between a signal at a positive input terminal and a signal at a negative input terminal. The amplifier 42A includes the positive input terminal that is coupled to the negative input terminal of the amplifier 42C, is coupled to the one end of the resistor 41A, and is supplied with the signal SIGA, and the negative input terminal that is coupled to the positive input terminal of the amplifier 42B, is coupled to the one end of the resistor 41B, and is supplied with the signal SIGB. The amplifier 42B includes the positive input terminal that is coupled to the negative input terminal of the amplifier 42A, is coupled to the one end of the resistor 41B, and is supplied with the signal SIGB, and the negative input terminal that is coupled to the positive input terminal of the amplifier 42C, is coupled to the one end of the resistor 41C, and is supplied with the signal SIGC. The amplifier 42C includes the positive input terminal that is coupled to the negative input terminal of the amplifier 42B, is coupled to the one end of the resistor 41C, and is supplied with the signal SIGC, and the negative input terminal that is coupled to the positive input terminal of the amplifier 42A, is coupled to the resistor 41A, and is supplied with the signal SIGA.

With this configuration, the amplifier 42A outputs a signal that corresponds to a difference AB (SIGA-SIGB) between the signal SIGA and the signal SIGB. The amplifier 42B outputs a signal that corresponds to a difference BC (SIGB-SIGC) between the signal SIGB and the signal SIGC. The amplifier 42C outputs a signal that corresponds to a difference CA (SIGC-SIGA) between the signal SIGC and the signal SIGA.

FIG. 9 illustrates one example of the signals SIGA to SIGC to be received by the reception unit 40. In this example, the reception unit 40 receives the six symbols "+x", "−y", "−z", "+z", "+v", and "−x" in this order. At this occasion, a voltage of the signal SIGA changes as follows: VH, VM, VH, VL, VM, and VL. A voltage of the signal SIGB changes as follows: VL, VL, VM, VM, VH, and VH. A voltage of the signal SIGC changes as follows: VM, VH, VL, VH, VL, and VM. In accordance therewith, the differences AB, BC, and CA also change. For example, the difference AB changes as follows: +2ΔV, +ΔV, +ΔV, −ΔV, −ΔV, and −2ΔV. The difference BC changes as follows: −ΔV, −2ΔV, +ΔV, −ΔV, +2ΔV, and +ΔV. The difference CA changes as follows: −ΔV, +ΔV, −2ΔV, +2ΔV, −ΔV, and +ΔV. Here, ΔV is a difference between any two adjacent voltages out of the three voltages (the high level voltage VH, the medium level voltage VM, and the low level voltage VL).

FIG. 10 illustrates one operation example of the amplifiers 42A, 42B, and 42C, in a case where the reception unit receives the symbol "+x". In this example, the voltage of the signal SIGA is the high level voltage VH. The voltage of the signal SIGB is the low level voltage VL. The voltage of the signal SIGC is the medium level voltage VM. In this case, a current I in flows in the following order: the input terminal TinA, the resistor 41A, the resistor 41B, and the input terminal TinB. Moreover, the positive input terminal of the amplifier 42A is supplied with the high level voltage VH, while the negative input terminal is supplied with the low level voltage VL, causing the difference AB to be positive. Accordingly, the amplifier 42A outputs "1". Moreover, the positive input terminal of the amplifier 42B is supplied with the low level voltage VL, while the negative input terminal is supplied with the medium level voltage VM, causing the difference BC to be negative. Accordingly, the amplifier 42B outputs "0". Moreover, the positive input terminal of the amplifier 42C is supplied with the medium level voltage VM, while the negative input terminal is supplied with the high level voltage VH, causing the difference CA to be negative. Accordingly, the amplifier 42C outputs "0".

The clock generator unit 43 generates the clock signal RxCK on the basis of the output signals of the amplifiers 42A, 42B, and 42C.

The flip flop 44 allows the output signals of the amplifiers 42A, 42B, and 42C to be delayed by a term of one clock of the clock signal RxCK, and outputs the respective resultant signals. The flip flop 45 allows the three output signals of the flip flop 44 to be delayed by the term of one clock of the clock signal RxCK, and outputs the respective resultant signals.

The signal generator unit 46 generates transition signals RxF, RxR, and RxP, on the basis of the output signals of the flip flops 44 and 45 and on the basis of the clock signal RxCK. The transition signals RxF, RxR, and RxP respectively correspond to the transition signals TxF9, TxR9, and TxP9 in the transmission device 10, and indicate the transitions of the symbol. The signal generator unit 46 identifies the transition of the symbol (FIG. 3) on the basis of the symbol indicated by the output signals of the flip flop 44 and on the basis of the symbol indicated by the output signals of the flip flop 45, to generate the transition signals RxF, RxR, and RxP.

The processor unit 32 (FIG. 1) performs predetermined processing on the basis of the transition signals RxF, RxR, and RxP and on the basis of the clock signal RxCK.

[Transmission Line 100]

FIG. 11 illustrates one configuration example of the transmission line 100. The transmission line 100 is constituted by a so-called strip line. The transmission line 100 includes a conductive layer 101, a dielectric layer 102, and a conductive layer 103, in addition to the line 110A to 110C.

The conductive layers 101 and 103 are made of, for example, metal, and are grounded in this example. The dielectric layer 102 is made of a dielectric. Relative permittivity Er of the dielectric layer 102 is "4.3" in this example.

In the transmission line 100, the conductive layer 101, the dielectric layer 102, and the conductive layer 103 are stacked in this order.

The lines 110A, 110B, and 110C are provided, inside the dielectric layer 102, at a position at a distance d1 from the conductive layer 101, and at a position at a distance d2 from the conductive layer 103. The distance d1 is 0.06 [mm] in this example. The distance d2 is 0.1 [mm] in this example. The lines 110A, 110B, and 110C are formed with widths WA, WB, and WC, and are disposed side by side in this order at a pitch P. The widths WA, WB, and WC are each 0.05 [mm] in this example. The pitch P is 0.075 [mm] in this example.

In the transmission line 100, the characteristic impedance of the line 110B is higher than the characteristic impedance of the lines 110A and 110C. Specifically, for example, a resistance value of the line 110B may be higher than resistance values of the lines 110A and 110C. At this occasion, for example, the line 110B may be formed with the use of a material having high resistivity. Moreover, the resistance value of the line 110B may be increased by mixing an impurity with the line 110B. That way, in the communication system 1, it is possible to enhance the communication quality, as described later.

Here, the line 110A corresponds to one specific example of a "first line" of a first transmission line in the disclosure. The line 110B corresponds to one specific example of a "second line" of the first transmission line in the disclosure. The line 110C corresponds to one specific example of a "third line" of the first transmission line in the disclosure.

[Operation and Workings]

Description is given next of operation and workings of the communication system 1 according to this embodiment.

[Outline of Overall Operation]

First, description is given on an outline of overall operation of the communication system 1 with reference to FIG. 1. The clock generator unit 11 of the transmission device 10 generates the clock signal TxCK. The processor unit 12 performs the predetermined processing, to generate the transition signals TxF0 to TxF6, TxR0 to TxR6, and TxP0 to TxP6. The transmission unit 20 generates the signals SIGA, SIGB, and SIGC on the basis of the transition signals TxF0 to TxF6, TxR0 to TxR6, and TxP0 to TxP6. The transmission line 100 transmits the signals SIGA, SIGB, and SIGC. The reception unit 40 of the reception device 30 receives the signals SIGA, SIGB, and SIGC, and generates the transition signals RxF, RxR, and RxP and the clock signal RxCK, on the basis of the signals SIGA, SIGB, and SIGC. The processor unit 32 performs the predetermined processing, on the basis of the transition signals RxF, RxR, and RxP and on the basis of the clock signal RxCK.

[Regarding Transmission Line 100]

In the transmission line 100, the characteristic impedance of the line 110B is higher than the characteristic impedance of the lines 110A and 110C. Hence, in the communication system 1, it is possible to enhance the communication quality. Detailed description is given below.

FIG. 12 illustrates one example of differential insertion loss characteristics in the transmission line 100. In FIG. 12, a horizontal axis denotes a frequency, whereas a vertical axis denotes an S parameter Sdd21. A characteristic WAC1 indicates a differential insertion loss characteristic of the lines 110A and 110C. A characteristic WAB1 indicates a differential insertion loss characteristic of the lines 110A and 110B. It is to be noted that a differential insertion loss characteristic of the lines 110B and 110C is substantially equal to the differential insertion loss characteristic of the lines 110A and 110B (the characteristic WAB1). In the transmission line 100, it is possible to allow the differential insertion loss characteristic of the lines 110A and 110B (the characteristic WAB1) and the differential insertion loss characteristic of the lines 110A and 110C (the characteristic WAC1) to approximate to each other, and to reduce a differential insertion loss, as compared to a case of a comparative example described later.

FIG. 13 illustrates one example of differential reflection characteristics in the transmission line 100. In FIG. 13, a horizontal axis denotes a frequency, whereas a vertical axis denotes an S parameter Sdd11. A characteristic WAC2 indicates a differential reflection characteristic of the lines 110A and 110C. A characteristic WAB2 indicates a differential reflection characteristic of the lines 110A and 110B. It is to be noted that a differential reflection characteristic of the lines 110B and 110C is substantially equal to the differential reflection characteristic of the lines 110A and 110B. In the transmission line 100, it is possible to improve the differential reflection characteristic of the lines 110A and 110B (the characteristic WAB2), as compared to the case of the comparative example described later.

[Comparative Example]

Description is given next of a transmission line 100R according to the comparative example. The transmission line 100R includes lines 110RA, 110RB, and 110RC, as with the case of this embodiment (FIG. 11). Unlike the transmission line 100 according to this embodiment, in the transmission line 100R, the lines 100RA, 100RB, and 100RC are equal in characteristic impedance to each other.

FIG. 14 illustrates one example of differential insertion loss characteristics in the transmission line 100R. A characteristic WAC3 indicates a differential insertion loss characteristic of the lines 110RA and 110RC. A characteristic WAB3 indicates a differential insertion loss characteristic of the lines 110RA and 110RB. In the transmission line 100R, a difference between the differential insertion loss characteristic (the characteristic WAB3) of the lines 110RA and 110RB and the differential insertion loss characteristic (the characteristic WAC3) of the lines 110RA and 110RC is slightly larger, as compared to the case of the transmission line 100 according to this embodiment (FIG. 12). Moreover, in the transmission line 100R, a value of the S parameter Sdd21 is lower, as compared to the case of the transmission line 100 (FIG. 12). In other words, in the transmission line 100R, the differential insertion loss becomes larger, as compared to that of the transmission line 100.

FIG. 15 illustrates one example of differential reflection characteristics in the transmission line 100R. A characteristic WAC4 indicates a differential reflection characteristic of the lines 110RA and 110RC. A characteristic WAB4 indicates a differential reflection characteristic of the lines 110RA and 110RB. In the transmission line 100R, a value of the S parameter Sdd11 of the lines 110RA and 110RB is higher, as compared to the case of the transmission line 100 according to this embodiment (FIG. 13). In other words, in the transmission line 100R, the differential reflection characteristic of the lines 100RA and 100RB (the characteristic WAB4) is lowered.

As described, in the transmission line 100 and the transmission line 100R, the three lines are disposed side by side, causing inter-line distances to differ from one another. Specifically, for example, in the transmission line 100R, a distance from the line 110RA to the line 110RB is shorter than a distance from the line 110RA to the line 110RC. Likewise, a distance from the line 110RB to the line 110RC is shorter than a distance from the line 110RA to the line 110RC. Accordingly, in a case where the lines 110RA, 110RB, and 110RC are equal in the characteristic impedance to one another, a difference between the characteristic impedance of the lines 110RA and 110RB, and the characteristic impedance of the lines 110RA and 110RB becomes large. Likewise, a difference between the characteristic impedance of the lines 110RA and 110RC, and the characteristic impedance of the lines 110RB and 110RC becomes large. As a result, in the transmission line 100R, as illustrated in FIG. 14, the differential insertion loss characteristic of the lines 110RA and 110RB (the characteristic WAB3) is lowered, as compared to the differential insertion loss characteristic of the lines 110RA and 110RC (the characteristic WAC3). In addition, as illustrated in FIG. 15, the differential reflection characteristic of the lines 110RA and 110RB (the characteristic WAB4) is lowered. In such a case, an eye opening of a differential signal is narrowed, causing possibility of lowered communication quality.

Meanwhile, in the transmission line 100 according to this embodiment, the characteristic impedance of the line 110B is higher than the characteristic impedance of the lines 110A and 110C. This makes it possible to allow the differential impedance of the lines 110A and 110B, the differential impedance of the lines 110B and 110C, and the differential impedance of the lines 110A and 110C to approximate to one another. In the transmission line 100, as described, it is possible to enhance symmetry of the differential impedance. Hence, it is possible to reduce the differential insertion loss, as illustrated in FIG. 12, and to improve the differential reflection characteristic of the lines 110A and 110B (the characteristic WAB2), as illustrated in FIG. 13. As a result, it is possible to enlarge the eye opening of the differential signal, leading to enhancement in the communication quality.

[Effects]

As described, in this embodiment, the characteristic impedance of the middle line of the three lines is higher than the characteristic impedance of the other lines. Hence, it is possible to enhance the communication quality.

[Modification Example 1-1]

In the forgoing embodiment, the resistance value of the line 110B is higher than the resistance values of the lines 110A and 110C. At this occasion, for example, instead of forming the line 110B with the use of the material having high resistivity, the lines 110A and 110C may be formed with the use of a material having low resistivity. This also makes it possible to allow the characteristic impedance of the line 110B to be higher than the characteristic impedance of the lines 110A and 110C. Hence, it is possible to enhance the communication quality.

[Modification Example 1-2]

In the forgoing embodiment, the resistance value of the line 110B is higher than the resistance values of the lines 110A and 110C, but this is non-limiting. In one alternative, for example, as in a transmission line 100B as illustrated in FIG. 16, permittivity of a part WP near the line 110B in the dielectric layer 102 may be lowered. In another alternative, for example, permittivity of a part near the line 110A in the dielectric layer 102 may be increased, while permittivity of a part near the line 110C in the dielectric layer 102 may be increased. This also makes it possible to allow the characteristic impedance of the line 110B to be higher than the characteristic impedance of the lines 110A and 110C. Hence, it is possible to enhance the communication quality.

[Modification Example 1-3]

In the forgoing embodiment, the width WA of the line 110A, the width WB of the line 110B, and the width WC of the line 110C are equal to one another. However, this is non-limiting. Alternatively, for example, as in a transmission line 100C as illustrated in FIG. 17, the width WB of the middle line of the three lines (a line 110B2) may be smaller than the widths WA and WC of the other lines. In this example, the width WB is 0.03 [mm]. The widths WA and WC are each 0.05 [mm]. Moreover, the pitch P is 0.085 [mm]. In this way as well, it is possible to allow the characteristic impedance of the line 110B2 to be higher than the characteristic impedance of the lines 110A and 110C. Hence, it is possible to enhance the communication quality.

[Modification Example 1-4]

In the forgoing embodiment, the conductive layers 101 and 103 cover the three lines 110A, 110B, and 110C. However, this is non-limiting. In one alternative, for example, as in a transmission line 100D as illustrated in FIG. 18, the conductive layer 103 may be formed in a region confronted with the line 110A and in a region confronted with the line 110C, with no conductive layer formed in a region confronted with the line 110B. A width WO of the region confronted with the line 110B where no conductive layer is formed may be, for example, 0.1 [mm].

[Modification Example 1-5]

In the forgoing embodiment, the transmission device 10 includes the single transmission unit 20, whereas the reception device 30 includes the single reception unit 40. However, this is non-limiting. The transmission device may include a plurality of transmission units, whereas the reception device may include a plurality of reception units. In what follows, a communication system 1E according to this modification example is described in detail.

FIG. 19 illustrates one configuration example of the communication system 1E. The communication system 1E includes a transmission device 10E, a transmission line 100E, and a reception device 30E.

The transmission device 10E includes a processor unit 12E and three transmission units 201 to 203. The processor unit 12E performs predetermined processing, to generate transition signals TxF10 to TxF16, TxR10 to TxR16, TxP10 to TxP16, TxF20 to TxF26, TxR20 to TxR26, TxP20 to TxP26, TxF30 to TxF36, TxR30 to TxR36, and TxP30 to TxP36. The transmission unit 201 generates signals SIGA1, SIGB1, and SIGC1, on the basis of the transition signals TxF10 to TxF16, TxR10 to TxR16, and TxP10 to TxP16, as with the transmission unit 20 according to the forgoing embodiment. The transmission unit 202 generates signals SIGA2, SIGB2, and SIGC2, on the basis of the transition signals TxF20 to TxF26, TxR20 to TxR26, and TxP20 to TxP26, as with the transmission unit 20 according to the forgoing embodiment. The transmission unit 203 generates signals SIGA3, SIGB3, and SIGC3, on the basis of the transition signals TxF30 to TxF36, TxR30 to TxR36, and TxP30 to TxP36, as with the transmission unit 20 according to the forgoing embodiment.

The transmission line 100E includes lines 110A1, 110B1, and 110C1, lines 110A2, 110B2, and 110C2, and lines 110A3, 110B3, and 110C3. The line 100A1 transmits the signal SIGA1. The line 110B1 transmits the signal SIGB1. The line 110C1 transmits the signal SIGC1. In other words, the lines 110A1, 110B1, and 110C1 constitute a single trio line. Likewise, the line 110A2 transmits the signal SIGA2. The line 110B2 transmits the signal SIGB2. The line 110C2 transmits the signal SIGC2. In other words, the lines 110A2, 110B2, and 110C2 constitute a single trio line. The line 110A3 transmits the signal SIGA3. The line 110B3 transmits the signal SIGB3. The line 110C3 transmits the signal SIGC3. In other words, the lines 110A3, 110B3, and 110C3 constitute a single trio line.

The reception device 30E includes three reception units 401 to 403, and a processor unit 32E. The reception unit 401 generates transition signals RxF1, RxR1, and RxP1, and a clock signal RxCK1, on the basis of the signals SIGA1, SIGB1, and SIGC1, as with the reception unit 40 according to the forgoing embodiment. Likewise, the reception unit 402 generates transition signals RxF2, RxR2, and RxP2, and a clock signal RxCK2, on the basis of the signals SIGA2, SIGB2, and SIGC2. The reception unit 403 generates transition signals RxF3. RxR3, and RxP3, and a clock signal RxCK3, on the basis of the signals SIGA3, SIGB3, and SIGC3. The processor unit 32E performs predetermined processing, on the basis of the transition signals RxF1, RxR1, and RxP1, and the clock signal RxCK1, on the basis of the transition signals RxF2, RxR2, and RxP2, and the clock signal RxCK2, and on the basis of the transition signals RxF3, RxR3, and RxP3, and the clock signal RxCK3.

FIG. 20 illustrates one configuration example of the transmission line 100E. In the transmission line 100E, as with the transmission line 100 according to the forgoing embodiment (FIG. 11), in the dielectric layer 102, the lines 110A1, 110B1, 110C1, 110A2, 110B2, 110C2, 110A3, 110B3, and 110C3 are disposed side by side in this order at the pitch P. A width WA1 of the line 110A1, a width WC1 of the line 110C1, a width WB2 of the line 110B2, a width WA3 of the line 110A3, and a width WC3 of the line 110C3 are each, for example, 0.03 [mm]. Moreover, a width WB1 of the line 110B1, a width WA2 of the line 110A2, a width WC2 of the line 110C2, and a width WB3 of the line 110B3 are each, for example, 0.05 [mm]. The pitch P is, for example, 0.085 [mm]. Thus, in the transmission line 100E, wide lines and narrow lines are alternatively disposed.

FIG. 21 illustrates one example of differential insertion loss characteristics regarding the lines 110A1, 110B1, and 110C1. Each numerical value in a row "the line 110A1/the line 110B1" indicates a value of the S parameter Sdd21 of the lines 110A1 and 110B1. Likewise, each numerical vale in a row "the line 110B1/the line 110C1" indicates a value of the S parameter Sdd21 of the lines 11081 and 110C1. Each numerical value in a row "the line 110A1/the line 110C" indicates a value of the S parameters Sdd21 of the lines 110A1 and 110C 1. Values in parentheses indicate one example of the differential insertion loss characteristics in a case where the widths of all the lines are equal to each other. In this comparative example, the widths of all the lines are each 0.05 [mm], and a pitch is 0.075 [mm].

It is to be noted that FIG. 21 illustrates the example of the differential insertion loss characteristics regarding the lines 110A1, 11081, and 110C1, but the same applies to differential insertion loss characteristics regarding the lines 110A3, 110B3, and 110C3.

FIG. 22 illustrates one example of differential insertion loss characteristics regarding the lines 110A2, 110B2, and 110C2. Each numerical value in a row "the line 110A2/the line 110B2" indicates a value of the S parameter Sdd21 of the lines 110A2 and 110B2. Likewise, each numerical value in a row "the line 110B2/the line 110C2" indicates a value of the S parameter Sdd21 of the lines 110B2 and 110C2. Each numerical value in a row "the line 110A2/the line 110C2" indicates a value of the S parameter Sdd21 of the lines 110A2 and 110C2. Values in parentheses indicate, as with FIG. 21, one example of the differential insertion loss characteristics in the case where the widths of all the lines are equal to one another.

As illustrated in FIGS. 21 and 22, in this modification example, it is possible to improve the differential insertion loss, for example, by about 0.3 to 0.5 dB both inclusive at 2.5 [GHz]. Hence, in the communication system 1E, it is possible to enhance the communication quality.

[Modification Example 1-6]

In the forgoing embodiment, the three lines included in the trio line are formed at the same level, but this is non-limiting. In the following, a communication system 1F according to this modification example is described in detail.

As illustrated in FIG. 19, the communication system 1F includes a transmission line 160F. The transmission line 160F includes lines 170A1, 170B1, and 170C1, the lines 170A2, 170B2, and 170C2, and the lines 170A3, 170B3, and 170C3.

FIG. 23 illustrates one configuration example of the transmission line 160F. In the transmission line 160F, inside the dielectric layer 102, the lines 170A1, 17081, and 170C1 are formed in this order at different levels from one another. The line 170A1 and the line 170B1 are disposed in confronted relation, while the line 170B1 and the line 170C1 are disposed in the confronted relation. Likewise, in the transmission line 160F, inside the dielectric layer 102, the lines 170A2, 170B2, and 170C2 are formed in this order at different levels from one another. The line 170A2 and the line 170B2 are disposed in the confronted relation, while the line 170B and the line 170C2 are disposed in the confronted relation. Likewise in the transmission line 160F, inside the dielectric layer 102, the lines 170A3, 170B3, and 170C3 are formed in this order at different levels from one another. The line 170A3 and the line 170B3 are disposed in the confronted relation, while the line 170B3 and the line 170C3 are disposed in the confronted relation. The lines 170A1, 170A2, and 170A3 are formed at the same level. The lines 170B1, 170B2, and 170B3 are formed at the same level. The lines 170C1, 170C2, and 170C3 are formed at the same level.

In the transmission line 160F, the three lines that constitute the single trio line are disposed at the different levels from one another. In this way, for example, the line 170B1 is disposed at a position that is different from those of the lines 170A1 and C1 and is away from both the conductive layer 101 and the conductive layer 103. Likewise, the line 170B2 is disposed at a position that is different from those of the lines 170A2 and C2 and is away from both the conductive layer 101 and the conductive layer 103. The line 170B3 is disposed at a position that is different from those of the lines 170A3 and C3 and is away from both the conductive layer 101 and the conductive layer 103. Thus, it is possible to allow the characteristic impedance of the line 170B1 to be higher than the characteristic impedance of the lines 170A1 and 170C1. It is possible to allow the characteristic impedance of the line 170B2 to be higher than the characteristic impedance of the lines 170A2 and 170C2. It is possible to allow the characteristic impedance of the line 170B3 to be higher than the characteristic impedance of the lines 170A3 and 170C3. As a result, in the communication system 1F, it is possible to enhance the communication quality.

[Other Modification Examples]

Moreover, two or more of these modification examples may be combined.

[2. Second Embodiment]

Description is given next of a communication system 2 according to a second embodiment. This embodiment includes forming a plurality of lines at two levels. It is to be noted that constituent parts that are substantially the same as those of the communication system 1 according to the forgoing first embodiment are denoted by the same reference characters, and description thereof is omitted as appropriate.

As illustrated in FIG. 1, the communication system 2 includes a transmission line 120. The transmission line 120 includes lines 130A, 130B, and 130C. In the transmission line 120, unlike the transmission line 100) according to the forgoing first embodiment, the lines 130A, 130B and 130C are substantially equal in the characteristic impedance to one another.

FIG. 24 illustrates one configuration example of the transmission line 120. The lines 130A and 130C are provided, inside the dielectric layer 102, at a position at a distance d11 from the conductive layer 101. The line 130B is disposed, inside the dielectric layer 102, at a position at a distance d13 from the conductive layer 103. A level at which the lines 130A and 130C are formed and a level at which the line 130B is formed are spaced away by a distance d12. In other words, the layer 110B is provided at a different level from those of the lines 110A and 110C. In this example, the distance d11 is 0.06 [mm]. The distance d12 is 0.06 [mm]. The distance d13 is 0.06 [mm]. Moreover, in this example, the width WA of the line 130A, the width WB of the line 130B, and the width WC of the line 130C are each 0.05 [mm]. The pitch P between the lines 130A, 130B, and 130C in an in-plane direction of the transmission line 120 is 0.025 [mm] in this example.

Here, the line 130A corresponds to one specific example of a "first line" of a second transmission line in the disclosure. The line 130B corresponds to one specific example of a "second line" of the second transmission line in the disclosure. The line 130C correspond to one specific example of a "third line" of the second transmission line in the disclosure.

As described, in the transmission line 120, the adjacent lines are formed at the different levels from one another, making it possible to increase the inter-line distances. This makes it possible to allow differential impedance of the lines 130A and 130B, differential impedance of the lines 130B and 130C, and differential impedance of the lines 130A and 130C to approximate to one another. Thus, in the transmission line 120, it is possible to enhance the symmetry of the differential impedance, leading to the enhancement in the communication quality.

Moreover, in the transmission line 120, as described, the adjacent lines are formed at the different levels from one another. This makes it possible to reduce the pitch P between the lines 130A, 130B, and 130C in the in-plane direction of the transmission line 120. As a result, in the transmission line 120, it is possible to reduce wiring area.

As described, in this embodiment, the adjacent lines are formed at the different levels from one another. Hence, it is possible to enhance the communication quality, and to reduce the wiring area.

[Modification Example 2-1]

In the forgoing embodiment, the transmission device 10 includes the single transmission unit 20, whereas the reception device 30 includes the single reception unit 40. However, this is non-limiting. As with the case of the modification example 1-5 (FIG. 19), the transmission device may include the plurality of the transmission units, whereas the reception device may include the plurality of the reception units. In what follows, a communication system 2A according to this modification example is described in detail.

FIG. 25 illustrates one configuration example of the communication system 2A. The communication system 2A includes the transmission device 10E, a transmission line 120A, and the reception device 30E. The transmission line 120A includes lines 130A1, 130B1, and 130C1, lines 130A2, 130B2, and 130C2, lines 130A3, 130B3, and 130C3, and a line GL. The line 130A1 transmits the signal SIGA1. The line 130B1 transmits the signal SIGB1. The line 130C1 transmits the signal SIGC1. In other words, the lines 130A1, 130B1, and 130C1 constitute a single trio line. Likewise, the line 130A2 transmits the signal SIGA2. The line 130B2 transmits the signal SIGB2. The line 130C2 transmits the signal SIGC2. In other words, the lines 130A2, 130B2, and 130C2 constitute a single trio line. The line 130A3 transmits the signal SIGA3. The line 130B3 transmits the signal SIGB3. The line 130C3 transmits the signal SIGC3. In other words, the lines 130A3, 130B3, and 130C3 constitute a single trio line. The line GL is grounded.

FIG. 26 illustrates one configuration example of the transmission line 120A. The lines 130A1, 130B2, 130B3, 130C1 and GL are disposed side by side in this order, at a first level inside the dielectric layer 102. Moreover, the lines 130A2, 130A3, 130B1, 130C2, and 130C3 are disposed side by side in this order, at a second level inside the dielectric layer 102. The line 130A1 and the line 130A2 are disposed in the confronted relation. The line 130B2 and the line 130A3 are disposed in the confronted relation. The line 130B3 and the line 130B1 are disposed in the confronted relation. The line 130C 1 and the line 130C2 are disposed in the confronted relation. The line GL and the line 130C3 are disposed in the confronted relation.

In the transmission line 120A, the three lines that constitute the single trio line are disposed out of adjacency to one another at the same level. For example, in the transmission line 120A, the lines 130A1, 130B1, and 130C1 are disposed out of adjacency to one another at the same level. Specifically, in the in-plane direction of the transmission line 120A, the lines 130A1, 130B1, and 130C1 are disposed in this order, while the line 130B1 is disposed at a different level from those of the lines 130A1 and 130C1. Likewise, the lines 130A2, 130B2, and 130C2 are disposed out of adjacency to one another at the same level. The lines 130A3, 130B3, and 130C3 are disposed out of adjacency to one another at the same level.

As described, in the transmission line 120A, for example, the lines 130A1, 130B1, and 130C1 are disposed out of adjacency to one another at the same level. This makes it possible to allow differential impedance of the lines 130A1 and 130B1, differential impedance of the lines 130B1 and 130C1, and differential impedance of the lines 130A1 and 130C1 to approximate to one another. Hence, in the transmission line 120A, it is possible to enhance the symmetry of the differential impedance, leading to the enhancement in the communication quality. The same applies to the lines 130A2, 130B2, and 130C2, and the same applies to the lines 130A3, 130B3, and 130C3.

It is to be noted that disposition of the lines is not limited to the example of the transmission line 120A. In one alternative, for example, the lines may be disposed as in a transmission line 120B as illustrated in FIG. 27. In the transmission line 120B, for example, the line 130C1 is disposed at a different level from those of the lines 130A1 and 130B1. Moreover, for example, in an in-plane direction of the transmission line 120B, the lines 130B2, 130A2, and 130C2 are disposed in this order. With this disposition as well, it is possible to keep the lines 130A1, 130B1, and 130C1 from being in adjacency to one another at the same level. It is possible to keep the lines 130A2, 130B2, and 130C2 from being in adjacency to one another at the same level. It is possible to keep the lines 130A3, 130B3, and 130C3 from being in adjacency to one another at the same level. Hence, in the transmission line 120B, it is possible to enhance the symmetry of the differential impedance, leading to the enhancement in the communication quality.

[Third Embodiment]

Description is given next of a communication system 3 according to a third embodiment. This embodiment includes providing three transmission units and three reception units. It is to be noted that constituent parts that are substantially the same as those of the communication system 1 according to the forgoing first embodiment are denoted by the same reference characters, and description thereof is omitted as appropriate.

FIG. 28 illustrates one configuration example of the communication system 3. The communication system 3 includes a transmission device 50 and a transmission line 140.

The transmission device 50 includes delay units 51, 52, and 53. The delay unit 51 delays the clock signal TxCK, and supplies a delayed clock signal to the transmission unit 201. The delay unit 52 delays the clock signal TxCK, and supplies a delayed clock signal to the transmission unit 202. The delay unit 53 delays the clock signal TxCK, and supplies a delayed clock signal to the transmission unit 203. In this example, an amount of delay in the delay units 51 and 53 is set at a larger value than an amount of delay in the delay unit 52.

The transmission line 140 includes lines 150A1, 150B1, and 150C1, lines 150A2, 150B2, and 150C2, lines 150A3, 150B3, and 1150C3, and lines GL1 and GL2. The line 150A1 transmits the signal SIGA1. The line 150B1 transmits the signal SIGB1. The line 150C1 transmits the signal SIGC1. In other words, the lines 150A1, 150B1, and 150C constitute a single trio line. Likewise, the line 150A2 transmits the signal SIGA2. The line 150B2 transmits the signal SIGB2. The line 150C2 transmits the signal SIGC2. In other words, the lines 150A2, 150B2, and 150C2 constitute a single trio line. The line 150A3 transmits the signal SIGA3. The line 150B3 transmits the signal SIGB3. The line 150C3 transmits the signal SIGC3. In other words, the lines 150A3, 150B3, and 150C3 constitute a single trio line. The lines GL1 and GL2 are grounded. These lines are formed at the same level as one another, as with the transmission line 100 according to the first embodiment (FIG. 11). In the transmission line 140, the lines 150A1, GL1, 150A3, 150A2, 150B3, 150B2, 150B1, 150C2, 150C1, GL2, and 150C3 are disposed side by side in this order.

Here, the lines 150A1, 150B1, and 150C1 correspond to one specific example of a "first trio line" of a third transmission line in the disclosure. The lines 150A2, 150B2, and 150C2 correspond to one specific example of a "second trio line" of the third transmission line in the disclosure.

In the transmission line 140, the three lines that constitute the single trio line are kept from being in adjacency to one another. Specifically, in the transmission line 140, the lines 150A1, 150B1, and 150C1 are kept from being in adjacency to one another. This makes it possible to allow the differential impedance of the lines 150A1 and 150B1, the differential impedance of the lines 150B1 and 150C1, and the differential impedance of the lines 150A1 and 150C1 to approximate to one another. Likewise, in the transmission line 140, the lines 150A2, 150B2, and 150C2 are kept from being in adjacency to one another. This makes it possible to allow the differential impedance of the lines 150A2 and 150B2, the differential impedance of the lines 150B2 and 150C2, and the differential impedance of the lines 150A2 and 150C2 to approximate to one another. Likewise, in the transmission line 140, the lines 150A3, 150B3, and 150C3 are kept from being in adjacency to one another. This makes it possible to allow the differential impedance of the lines 150A3 and 150B3, the differential impedance of the lines 150B3 and 150C3, and the differential impedance of the lines 150A3 and 150C3 to approximate to one another. As a result, in the transmission line 140, it is possible to enhance the symmetry of the differential impedance, leading to the enhancement in the communication quality.

As illustrated in FIG. 28, for example, out of the lines 150A1, 150B1, and 150C1, the line 150B1 is adjacent to the lines 150B2 and 150C2. The line 150C1 is adjacent to the line 150C2. Moreover, out of the lines 150A2, 150B2, and 150C2, the line 150A2 is adjacent to the lines 150A3 and 150B3. The line 150B2 is adjacent to the lines 150B3 and 150B1. The line 150C2 is adjacent to the lines 150B1 and 150C1. Moreover, out of the lines 150A3, 150B3, and 150C3, the line 150A3 is adjacent to the line 150A2. The line 150B3 is adjacent to the lines 150A2 and 150B2. Between the adjacent lines as mentioned above, there is possibility of occurrence of crosstalk. Therefore, in the communication system 3, the delay units 51 to 53 are provided, to shift transition timing of the signals, between the trio lines. Hence, in the communication system 3, it is possible to restrain degradation in the communication quality caused by the crosstalk between the adjacent lines.

FIG. 29 schematically illustrates phases of the signals. In this example, the phases of the signals SIGA1, SIGB1, SIGC1, SIGA3, SIGB3, and SIGC3 are each delayed by a phase difference PD, with respect to the phases of the signals SIGA2, SIGB2, and SIGC2. Here, the phase difference PD may be set at, for example, about a half of a unit interval U1.

In the communication system 3, as illustrated in FIG. 29, it is possible to shift the transition timing of the signals, between the trio lines. As a result, in the communication system 3, thanks to the shift of the transition timing, it is possible to reduce possibility that the eye opening is narrowed, even if the crosstalk occurs between the adjacent lines. This makes it possible to restrain the degradation in the communication quality.

As described, in this embodiment, the three lines that constitute the single trio line are kept from being in adjacency to one another. Hence, it is possible to enhance the communication quality.

In this embodiment, the transition timing of the signals are shifted, between the trio lines. Hence, it is possible to restrain the degradation in the communication quality.

[Modification Example 3-1]

In the forgoing embodiment, the grounded lines GL and GL2 are provided. However, this is non-limiting. In the following, this modification example is described in detail by giving some examples.

FIG. 30 illustrates one configuration example of a communication system 3A according to this modification example. The communication system 3A includes a transmission line 140A. The transmission line 140A includes the lines 150A1, 150B1, and 150C1 the lines 150A2, 150B2, and 150C2, and the lines 150A3, 150B3, and 150C3. In other words, the transmission line 140A is devoid of grounded lines, unlike the transmission line 140) according to the forgoing embodiment (FIG. 28). In the transmission line 140A, the lines 150A1, 150A2, 150A3, 150B1, 150B2, 150B3, 150C1, 150C2, and 150C3 are disposed side by side in this order. Thus, in the transmission line 140A, the three lines that constitute the single trio line are kept from being in adjacency to one another.

FIG. 31 schematically illustrates phases of the signals in the communication system 3A. In this example, the phases of the signals SIGA2. SIGB2, and SIGC2 are each delayed by a phase difference PD1 from the phases of the signals SIGA1, SIGB1 and SIGC1. The phases of the signals SIGA3, SIGB3, and SIGC3 are each delayed by a phase difference PD2 from the phases of the signals SIGA2, SIGB2, and SIGC2. Here, the phase differences PD1 and PD2 may each be set at, for example, about ⅓ of the unit interval U1.

FIG. 32 illustrates one configuration example of another communication system 3B according to this modification example. FIG. 33 schematically illustrates phases of the signals in the communication system 3B. The communication system 3B includes a transmission line 140B. In the transmission line 140B, the lines 150A1, 150A3, 150A2, 150B1, 150B2, 150B3, 150C2, 150C1, and 150C3 are disposed side by side in this order. In this example, in this example, as illustrated in FIG. 33, the phases of the signals SIGA3, SIGB3, and SIGC3 are each delayed by the phase difference PD1 from the phases of the signals SIGA2, SIGB2, and SIGC2. The phases of the signals SIGA1, SIGB1, and SIGC1 are each delayed by the phase difference PD2 from the phases of the signals SIGA3, SIGB3, and SIGC3.

FIG. 34 illustrates one configuration example of another communication system 3C according to this modification example. FIG. 35 schematically illustrates phases of the signals in the communication system 3C. The communication system 3C includes a transmission line 140C. In the transmission line 140C, the lines 150A1, 150A3, 150A2, 150B3, 150B2, 150C1, 150C2, 150C1, and 150C3 are disposed side by side in this order. In this example, as illustrated in FIG. 35, the phases of the signals SIGA3, SIGB3, and SIGC3 are each delayed by the phase difference PD1 from the phases of the signals SIGA2, SIGB2, and SIGC2. The phases of the signals SIGA1, SIGB1, and SIGC1 are each delayed by the phase difference PD2 from the phases of the signals SIGA3, SIGB3, and SIGC3.

[Modification Example 3-2]

In the forgoing embodiment, the delay units 51 to 53 delay the clock signal TxCK by the predetermined amount, but this is non-limiting. The amount of the delay in the delay units 51 to 53 may be adjusted. In what follows, a communication system 3D according to this modification example is described in detail.

FIG. 36 illustrates one configuration example of the communication system 3D according to this modification example. The communication system 3D includes a transmission device 50D, the transmission line 140, and a reception device 60D.

The transmission device 50D includes a processor unit 54D, a reception unit 56D, a control unit 57D, and delay units 51D to 53D.

The processor unit 54D performs predetermined processing to generate the transition signals TxF10 to TxF16, TxR10 to TxR16, TxP10 to TxP16, TxF20 to TxF26, TxR20 to TxR26, TxP20 to TxP26, TxF30 to TxF36, TxR30 to TxR36, and TxP30 to TxP36, as with the processor 12E. The processor unit 54D includes a data generator unit 55D. The data generator unit 55D generates, in a calibration mode, data (the transition signal) for calibration. With this configuration, the processor unit 54D outputs, in the calibration mode, the data generated by the data generator unit 55D, as the transition signals TxF10 to TxF16, TxR10 to TxR16, TxP10 to TxP16, TxF20 to TxF26, TxR20 to TxR26, TxP20 to TxP26, TxF30 to TxF36, TxR30 to TxR36, and TxP30 to TxP36.

The reception unit 56D receives a control signal CTL supplied from the reception device 60D, and supplies the control unit 57D with comparison result information INF (described later) included in the control signal CTL. The control unit 57D sets the amount of the delay in each of the delay units 51D to 53D, on the basis of the comparison result information INF. The delay units 51D to 53D each delay the clock signal TxCK by the amount of the delay in accordance with an instruction from the control unit 57D.

The reception device 60D includes a processor unit 64D and a transmission unit 66D. The processor unit 64D performs predetermined processing, on the basis of the transition signals RxF1, RxR1, and RxP1, and the clock signal RxCK1, on the basis of the transition signals RxF2, RxR2, and RxP2, and the clock signal RxCK2, and on the basis of the transition signals RxF3, RxR3, and RxP3, and the clock signal RxCK3, as with the processor unit 32E. The processor unit 64D includes a data comparison unit 65D. The data comparison unit 65D compares, in the calibration mode, the transition signals RxF1, RxR1, RxP1, RxF2, RxR2, RxP2, RxF3, RxR3, and RxP3 with predetermined data (the transition signal), to generate the comparison result information INF. The predetermined data corresponds to the data for the calibration generated by the data generator unit 55D. The transmission unit 66D generates the control signal CTL on the basis of the comparison result information INF, and transmits the control signal CTL to the transmission device 50D.

In the communication system 3D, in the calibration mode, first, the data generator unit 55D of the transmission device 50D generates the data (the transition signal) for the calibration. The control unit 57D sets the amount of the delay in the delay units 51D to 53D. The delay units 51D to 53D each delay the clock signal TxCK by the amount of the delay in accordance with the instruction from the control unit 57D. The transmission unit 201 generates the signals SIGA1, SIGB1, and SIGC1 on the basis of the clock signal supplied from the delay unit 51D. The transmission unit 202 generates the signals SIGA2, SIGB2, and SIGC2 on the basis of the clock signal supplied from the delay unit 52D, and generates the signals SIGA3, SIGB3, and SIGC3 on the basis of the clock signal supplied from the delay unit 53D.

Moreover, the reception unit 401 of the reception device 60D generates the transition signals RxF1, RxR1, and RxP1, and the clock signal RxCK1, on the basis of the signals SIGA1, SIGB1, and SIGC1. The reception unit 402 generates the transition signals RxF2. RxR2, and RxP2, and the clock signal RxCK2, on the basis of the signals SIGA2, SIGB2, and SIGC2. The reception unit 403 generates the transition signals RxF3, RxR3, and RxP3, and the clock signal RxCK3, on the basis of the signals SIGA3, SIGB3, and SIGC3. The data comparison unit 65D compares the transition signals RxF1, RxR1, RxP1, RxF2, RxR2. RxP2, RxF3, RxR3, and RxP3 with the predetermined data (the transition signal), to generate the comparison result information INF. The transmission unit 66D generates the control signal CTL on the basis of the comparison result information INF, and transmits the control signal CTL to the transmission device 50D.

Moreover, the reception unit 56D of the transmission device 50D receives the control signal CTL supplied from the reception device 60D, and supplies the control unit 57D with the comparison result information INF included in the control signal CTL. The control unit 57D sequentially changes the amount of the delay in the delay units 51D to 53D, and sequentially acquires the comparison result information INF. Moreover, the control unit 57D acquires a range of the amount of the delay in each of the delay units 51D to 53D that makes it possible to perform communication normally. Specifically, for example, with two of the delay units 51D to 53D being focused, setting of the amount of the delay is sequentially changed from setting that maximizes a skew to setting that minimizes the skew, to acquire the range of the amount of delay that makes it possible to perform communication normally. Moreover, the control unit 57D determines, on the basis of the range of the amount of the delay thus acquired, the amount of the delay, to increase an operation margin. Specifically, for example, the amount of the delay may be determined on the basis of a center value of the range of the amount of the delay that makes it possible to perform communication normally.

[Modification Example 3-3]

In the forgoing embodiment, the transition timing of the signals in the adjacent lines are shifted from one another, but this is non-limiting. For example, even if the transition timing of the signals in the adjacent lines substantially coincide, it is unnecessary to shift the transition timing in a case where the communication quality does not lower so significantly.

[4. Application Example]

Description is given next of an application example of the communication systems described in the forgoing embodiments and the modification examples.

FIG. 37 illustrates an external appearance of a smartphone 300 (a multifunction mobile phone) to which the communication systems according to the forgoing example embodiments are applied. The smartphone 300 may be equipped with various devices. The communication systems according to the forgoing example embodiments are applied to a communication system that performs data exchange among the devices.

FIG. 38 illustrates one configuration example of an application processor 310 utilized in the smartphone 300X). The application processor 310 includes a CPU (Central Processing Unit) 311, a memory control unit 312, a power supply control unit 313, an external interface 314, a GPU (Graphics Processing Unit) 315, a media processor unit 316, a display control unit 317, and an MIPI (Mobile Industry Processor Interface) interface 318. The CPU 311, the memory control unit 312, the power supply control unit 313, the external interface 314, the GPU 315, the media processor unit 316, and the display control unit 317 are coupled to a system bus 319 in this example, and are able to perform the data exchange with one another through the system bus 319.

The CPU 311 processes various pieces of information handled by the smartphone 300 in accordance with a program. The memory control unit 312 controls a memory 501 which the CPU 311 uses in performing information processing. The power supply control unit 313 controls a power supply of the smartphone 300.

The external interface 314 is an interface provided for communication with an external device. In this example, the external interface 314 is coupled to a wireless communication unit 502 and an image sensor 410. The wireless communication unit 502 performs wireless communication with a base station of mobile phones. The wireless communication unit 502 is so constituted that the wireless communication unit 502 includes a baseband unit and an RF (Radio Frequency) front end unit, without limitation. The image sensor 410 acquires an image. The image sensor 410 is so constituted that the image sensor 410 includes a CMOS sensor, without limitation.

The GPU 315 performs image processing. The media processor unit 316 processes information such as sound, characters, and figures. The display control unit 317 controls a display 504 through the MIPI interface 318. The MIPI interface 318 transmits an image signal to the display 504. As the image signal, for example, a signal of a YUV system, an RGB system, or other systems may be used. For example, the communication systems according to the forgoing example embodiments are applied to a communication system between the MIPI interface 318 and the display 504.

FIG. 39 illustrates one configuration example of the image sensor 410. The image sensor 410 includes a sensor unit 411, an ISP (Image Signal Processor) 412, a JPEG (Joint Photographic Experts Group) encoder 413, a CPU 414, a RAM (Random Access Memory) 415, a ROM (Read Only Memory) 416, a power supply control unit 417, an I²C (Inter-Integrated Circuit) interface 418, and an MIPI interface 419. These blocks are each coupled to a system bus 420 in this example, and are able to perform the data exchange with one another through the system bus 420.

The sensor unit 411 acquires the image, and is constituted by, for example, the CMOS sensor. The ISP 412 performs predetermined processing on the image acquired by the sensor unit 411. The JPEG encoder 413 encodes the image processed by the ISP 412, to generate an image of a JPEG form. The CPU 414 controls each block of the image sensor 410 in accordance with a program. The RAM 415 is a memory which the CPU 414 uses in performing image processing. The ROM 416 stores the program to be executed in the CPU 414. The power supply control unit 417 controls a power supply of the image sensor 410. The I²C interface 418 receives a control signal from the application processor 310. Moreover, although not illustrated, the image sensor 410 receives, from the application processor 310, a clock signal in addition to the control signal. Specifically, the image sensor 410 is configured to be able to operate on the basis of the clock signals having various frequencies. The MIPI interface 419 transmits the image signal to the application processor 310. As the image signal, for example, the signal of the YUV system, the RGB system, or other systems may be used. For example, the communication systems according to the forgoing example embodiments are applied to a communication system between the MIPI interface 419 and the application processor 310.

Although description has been made by giving the embodiments and the modification examples, and the application example to the electronic apparatus as mentioned above, the contents of the technology are not limited to the above-mentioned example embodiments and may be modified in a variety of ways.

For example, in the forgoing example embodiments, the transmission line is constituted by a strip line. However, this is non-limiting. Alternatively, for example, as illustrated in FIGS. 40 and 41, the transmission line may be constituted by a micro strip line. FIG. 40 illustrates one configuration example of a transmission line 800 according to this modification example, and corresponds to the transmission line 100 (FIG. 11). The transmission line 800 includes a dielectric layer 802, a conductive layer 803, and lines 810A, 810B, and 810C. The dielectric layer 802 and the conductive layer 803 are stacked. Moreover, the lines 810A, 810B, and 810C are formed on a surface of the dielectric layer 802. FIG. 41 illustrates one configuration example of another transmission line 820 according to this modification example, and corresponds to the transmission line 120 (FIG. 24). The transmission line 820 includes lines 830A, 830B, and 830C. The lines 830A and 830C are formed on the surface of the dielectric layer 802, whereas the line 830B is formed inside the dielectric layer 802.

Moreover, for example, in the forgoing example embodiments, in the case where the voltage of the output terminal ToutA is set at the medium level voltage VM, for example, two out of the control signals PU1A to PU5A are brought to "1", with the remaining ones being brought to "0", whereas for example, two out of the control signals PD1A to PD5A are brought to "1", with the remaining ones being brought to "0". However, this is non-limiting. Alternatively, for example, all the control signals PU1A to PU5A and PD1A to PD5A may be brought to "0". Thus, in the driver unit 29A, the five transistors 91 and the five transistors 94 are turned off, causing output impedance to be high impedance. At this occasion, the voltage of the output terminal ToutA is set at the medium level voltage VM by the resistors 41A to 41C of the reception unit 40.

It is to be noted that the technology may have the following configurations.

(1) A transmission line, including:
   a first line;
   a second line having characteristic impedance higher than characteristic impedance of the first line; and
   a third line,
   the transmission line transmitting a symbol that corresponds to a combination of signals in the first line, the second line, and the third line.

(2) The transmission line according to (1), in which
   the first line, the second line, and the third line are disposed in order at a same level as one another, and
   the characteristic impedance of the second line is higher than characteristic impedance of the third line.

(3) The transmission line according to (1) or (2), in which
   the second line is formed with use of a material having higher resistivity than the first line.

(4) The transmission line according to any one of (1) to (3), in which
   the second line includes more impurity than the first line.

(5) The transmission line according to any one of (1) to (4), in which
   a width of the second line is smaller than a width of the first line.

(6) The transmission line according to any one of (1) to (5), further including:
   a dielectric layer;
   a first conductive layer; and
   a second conductive layer,
   the first conductive layer, the dielectric layer, and the second conductive layer being stacked in order, and
   the first line, the second line, and the third line being formed inside the dielectric layer.

(7) The transmission line according to (6), in which
   the first conductive layer is formed in a region corresponding to the first line, and in a region corresponding to the third line.

(8) The transmission line according to any one of (1) to (5), further including:
   a dielectric layer; and
   a conductive layer,
   the dielectric layer and the conductive layer being stacked, and
   the first line, the second line, and the third line being formed on an opposite surface of the dielectric layer to a surface on which the conductive layer is provided.

(9) The transmission line according to any one of (6) to (8), in which
  permittivity of the dielectric layer in vicinity of the second line is lower than permittivity of the dielectric layer in vicinity of the first line.
(10) The transmission line according to (1), further including:
  a dielectric layer;
  a first conductive layer; and
  a second conductive layer,
  the first conductive layer, the dielectric layer, and the second conductive layer being stacked in order,
  the first line, the second line, and the third line being stacked in order at different levels from one another inside the dielectric layer, and
  the characteristic impedance of the second line being higher than characteristic impedance of the third line.
(11) A transmission line, including:
  a first line formed in a first layer,
  a second line formed in a second layer; and
  a third line formed in the first layer,
  the transmission line transmitting a symbol that corresponds to a combination of signals in the first line, the second line, and the third line.
(12) The transmission line according to (11), in which the second line is disposed between the first line and the third line, in a plane that crosses a direction in which the layers are stacked.
(13) The transmission line according to (12), further including a fourth line, a fifth line, and a sixth line, in which
  the fifth line is formed in the first layer,
  the fourth line and the sixth line are formed in the second layer,
  the first line is confronted with the fourth line,
  the second line is confronted with the fifth line, and
  the third line is confronted with the sixth line.
(14) A transmission line, including:
  a first trio line that includes three lines and transmits a first symbol corresponding to a combination of signals; and
  a second trio line that includes three lines and transmits a second symbol corresponding to a combination of signals,
  one of the three lines in the second trio line being disposed between two of the three lines in the first trio line.
(15) The transmission line according to (14), in which the three lines in the first trio line are disposed out of adjacency to one another.
(16) The transmission device according to (14) or (15), in which
  first transition timing of the signal transmitted by the first trio line and second transition timing of the signal transmitted by the second trio line are different from each other.
(17) A communication system, including:
  a transmission device;
  a reception device; and
  a transmission line that transmits a signal from the transmission device to the reception device,
  the transmission line including
    a first line,
    a second line having characteristic impedance higher than characteristic impedance of the first line, and
    a third line, and
    the transmission line transmitting a symbol that corresponds to a combination of signals in the first line, the second line, and the third line.
(18) A communication system, including:
  a transmission device;
  a reception device; and
  a transmission line that transmits a signal from the transmission device to the reception device,
  the transmission line including
    a first line formed in a first layer,
    a second line formed in a second layer, and
    a third line formed in the first layer, and
    the transmission line transmitting a symbol that corresponds to a combination of signals in the first line, the second line, and the third line.
(19) A communication system, including:
  a transmission device;
  a reception device; and
  a transmission line that transmits a signal from the transmission device to the reception device,
  the transmission line including
    a first trio line that includes three lines and transmits a first symbol corresponding to a combination of signals, and
    a second trio line that includes three lines and transmits a second symbol corresponding to a combination of signals,
    one of the three lines in the second trio line being disposed between two of the three lines in the first trio line.
(20) The communication system according to (19), in which
  the transmission device includes
    a first phase adjuster unit that adjusts phases of signals in the three lines of the first trio line; and
    a second phase adjuster unit that adjusts phases of signals in the three lines of the second trio line.
(21) The communication system according to (20), in which
  the transmission device further includes a control unit, the control unit transmitting a signal that includes a predetermined data pattern, and controlling the first phase adjuster unit and the second phase adjuster unit on the basis of a result of reception in the reception device of the signal that includes the predetermined data pattern.

This application claims the benefit of Japanese Priority Patent Application JP2015-97930 filed on May 13, 2015, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:
1. A transmission line, comprising:
  a first line;
  a second line having characteristic impedance higher than characteristic impedance of the first line; and
  a third line, wherein
  the transmission line is configured to transmit a symbol that corresponds to a combination of signals in the first line, the second line, and the third line,
  the first line, the second line, and the third line are disposed in order at a same height as one another, and
  the characteristic impedance of the second line is higher than characteristic impedance of the third line.
2. The transmission line according to claim 1, wherein an impurity level of the second line is higher than that of the first line.

3. The transmission line according to claim 1, wherein a width of the second line is smaller than a width of the first line.

4. The transmission line according to claim 1, further comprising:
a dielectric layer; and
a conductive layer,
the dielectric layer and the conductive layer being stacked, and
the first line, the second line, and the third line being formed on an opposite surface of the dielectric layer to a surface on which the conductive layer is provided.

5. A transmission line comprising:
a first line;
a second line having characteristic impedance higher than characteristic impedance of the first line; and
a third line, wherein
the transmission line is configured to transmit a symbol that corresponds to a combination of signals in the first line, the second line, and the third line, and
the second line is formed using a material having higher resistivity than the first line.

6. A transmission line comprising:
a first line;
a second line having characteristic impedance higher than characteristic impedance of the first line;
a third line, wherein the transmission line is configured to transmit a symbol that corresponds to a combination of signals in the first line, the second line, and the third line;
a dielectric layer;
a first conductive layer; and
a second conductive layer, wherein
the first conductive layer, the dielectric layer, and the second conductive layer are stacked in order,
the first line, the second line, and the third line is formed inside the dielectric layer, and
permittivity of the dielectric layer in vicinity of the second line is lower than permittivity of the dielectric layer in vicinity of the first line.

7. The transmission line according to claim 6, wherein the first conductive layer is formed in a region corresponding to the first line, and in a region corresponding to the third line.

8. A transmission line, comprising:
a first line formed in a first layer;
a second line formed in a second layer; and
a third line formed in the first layer,
the transmission line being configured to transmit a symbol that corresponds to a logical combination of discrete signal levels respectively represented in the first line, the second line, and the third line.

9. The transmission line according to claim 8, wherein the second line is disposed between the first line and the third line, in a plane that crosses a direction in which the layers are stacked.

10. The transmission line according to claim 9, further comprising a fourth line, a fifth line, and a sixth line, wherein
the fifth line is formed in the first layer,
the fourth line and the sixth line are formed in the second layer,
the first line is confronted with the fourth line,
the second line is confronted with the fifth line, and
the third line is confronted with the sixth line.

11. A transmission line, comprising:
a first trio line that includes three lines and transmits a first symbol corresponding to a combination of signals; and
a second trio line that includes three lines and transmits a second symbol corresponding to a combination of signals,
one of the three lines in the second trio line being disposed between two of the three lines in the first trio line.

12. The transmission line according to claim 11, wherein the three lines in the first trio line are disposed out of adjacency to one another.

13. The transmission device according to claim 11, wherein first transition timing of the signal transmitted by the first trio line and second transition timing of the signal transmitted by the second trio line are different from each other.

* * * * *